(12) United States Patent
Watanabe et al.

(10) Patent No.: US 7,276,324 B2
(45) Date of Patent: Oct. 2, 2007

(54) NITROGEN-CONTAINING ORGANIC COMPOUND, RESIST COMPOSITION AND PATTERNING PROCESS

(75) Inventors: Takeru Watanabe, Niigata-ken (JP); Takeshi Kinsho, Niigata-ken (JP); Koji Hasegawa, Niigata-ken (JP); Katsuya Takemura, Niigata-ken (JP); Kazumi Noda, Niigata-ken (JP); Katsuhiro Kobayashi, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 155 days.

(21) Appl. No.: 10/984,933

(22) Filed: Nov. 10, 2004

(65) Prior Publication Data

US 2005/0106500 A1    May 19, 2005

(30) Foreign Application Priority Data

Nov. 14, 2003   (JP)   ............... 2003-384505

(51) Int. Cl.
  G03C 1/73    (2006.01)
  G03F 7/038   (2006.01)
  G03F 7/039   (2006.01)
  G03F 7/20    (2006.01)
  G03F 7/30    (2006.01)

(52) U.S. Cl. ............... 430/270.1; 430/326; 430/325; 430/330

(58) Field of Classification Search ............... None
  See application file for complete search history.

(56) References Cited

U.S. PATENT DOCUMENTS

| | | | |
|---|---|---|---|
| 4,491,628 A | 1/1985 | Ito et al. | |
| 5,104,770 A * | 4/1992 | Usifer et al. | ............... 430/270.1 |
| 5,310,619 A | 5/1994 | Crivello et al. | |
| 6,004,724 A | 12/1999 | Yamato et al. | |
| 6,261,738 B1 | 7/2001 | Asakura et al. | |

FOREIGN PATENT DOCUMENTS

| | | | |
|---|---|---|---|
| JP | 41-19064 | * | 11/1964 |
| JP | 63-27829 A | | 2/1988 |
| JP | 2-27660 B2 | | 6/1990 |
| JP | 5-158239 A | | 6/1993 |
| JP | 5-232706 A | | 9/1993 |
| JP | 5-249662 A | | 9/1993 |
| JP | 5-249683 A | | 9/1993 |
| JP | 5-257282 A | | 10/1993 |
| JP | 5-289322 A | | 11/1993 |
| JP | 5-289340 A | | 11/1993 |
| JP | 6-194834 A | | 7/1994 |
| JP | 6-242605 A | | 9/1994 |
| JP | 6-242606 A | | 9/1994 |
| JP | 6-263716 A | | 9/1994 |
| JP | 6-263717 A | | 9/1994 |
| JP | 6-266100 A | | 9/1994 |
| JP | 6-266111 A | | 9/1994 |
| JP | 7-92678 A | | 4/1995 |
| JP | 7-92680 A | | 4/1995 |
| JP | 7-92681 A | | 4/1995 |
| JP | 7-120929 A | | 5/1995 |
| JP | 7-128859 A | | 5/1995 |
| JP | 7-134419 A | | 5/1995 |
| JP | 9-95479 A | | 4/1997 |
| JP | 9-208554 A | | 8/1997 |
| JP | 9-230588 A | | 9/1997 |
| JP | 9-301948 A | | 11/1997 |
| JP | 2906999 B2 | | 4/1999 |
| JP | 2000-314956 A | | 11/2000 |

OTHER PUBLICATIONS

Chemical Abstract 66:25580—Uhlig et al.*
Chemical Abstract 66:37778—Irikura et al.*
Chemical Abstract 71:61225—Carlsson et al.*
Chemical Abstract 85:177086—Takai et al.*
Chemical Abstract 123:355077—Stebani et al.*
Chemical Abstract 135:371308—Kubo et al.*
Chemical Abstract 136:381993—Boon et al.*
Chemical Abstract 69:51952—Oshiro et al.*
Chemical Abstract 77:151844—Schultz et al.*
Chemical Abstract 89:24213—Ochi et al.*
Chemical Abstract 102:132037—Hofman et al.*
Chemical Abstract 129:330308—Starkey et al.*
Hatakeyama, et al. "Investigation of Discrimination Enhancement with New Modeling for Poly-Hydroxystyrene Positive Resists" Journal of Photopolymer Science and Technology, vol. 13, No. 4, (2000) pp. 519-524.
Hinsberg, et al. "Fundamental Studies of Airborne Chemical Contamination of Chemically Amplified Resists" Journal of Photopolymer Science and Technology, vol. 6; No. 4 (1993) pp. 535-546.
Kumada, et al. "Study on Over-Top Coating of Positive Chemical Amplification Resists for KrF Excimer Laser Lithography" Journal of Photopolymer Science and Technology, vol. 6; No. 4 (1993) pp. 571-574.
Arimitsu, et al., "Sensitivity Enhancement of Chemical-Amplification-Type Photoimaging Materials by Acetoacetic Acid Derivatives" Journal of Photopolymer Science and Technology, vol. 8; No. 1 (1995) pp. 43-44.

(Continued)

Primary Examiner—Sin Lee
(74) Attorney, Agent, or Firm—Birch, Stewart, Kolasch & Birch, LLP

(57) ABSTRACT

Chemically amplified resist compositions comprising nitrogen-containing organic compounds having an aromatic carboxylic acid ester structure have an excellent resolution and provide a precise pattern profile and are useful in microfabrication using electron beams or deep-UV light.

12 Claims, No Drawings

OTHER PUBLICATIONS

Kudo, et al. "Enhancement of the Sensetivity of Chemical-Amplification-Type Photoimaging Materials by β-Tosyloxyketone Acetals." Journal of Photopolymer Science and Technology vol. 8; No. 1 (1995) pp. 45-46.

Arimitsu, et al. "Effect of Phenolic Hydroxyl Residues on the Improvement of Acid-Proliferation-Type Photoimaging Materials" Journal of Photopolymer Science and Technology, vol. 9, No. 1 (1996) pp. 29-30.

* cited by examiner

NITROGEN-CONTAINING ORGANIC COMPOUND, RESIST COMPOSITION AND PATTERNING PROCESS

CROSS-REFERENCE TO RELATED APPLICATION

This non-provisional application claims priority under 35 U.S.C. §119(a) on Patent Application No. 2003-384505 filed in Japan on Nov. 14, 2003, the entire contents of which are hereby incorporated by reference.

1. Technical Field

The present invention relates to a novel nitrogen-containing organic compound, a chemically amplified resist composition comprising the same and suitable for microfabrication technology, and a patterning process using the resist composition.

2. Background Art

Of the efforts currently being made to achieve a finer pattern rule in the drive for higher integration and operating speeds in LSI devices, deep-ultraviolet lithography is thought to hold particular promise as the next generation in microfabrication technology. Deep-UV lithography is capable of fabrication to dimensions of 0.2 µm or less and, when a resist having low light absorption is used, can form patterns with sidewalls that are nearly perpendicular to the substrate. One technology that has attracted a good deal of attention recently utilizes high-intensity KrF and ArF excimer lasers as the deep-UV light source. This technology is being used in mass production, prompting a desire for resists having a low light absorption and a high sensitivity.

Acid-catalyzed, positive-working chemically amplified resists (e.g., U.S. Pat. No. 4,491,628 and U.S. Pat. No. 5,310,619, or JP-B 2-27660 and JP-A 63-27829) developed in response to the above needs are endowed with excellent properties, including a high sensitivity, high resolution and good dry-etching resistance, which make them especially promising as resists for deep-UV lithography.

However, one problem with chemically amplified resists is that, when the standing time from exposure to post exposure bake (PEB) is long, the line pattern formed during patterning acquires a "T-top" profile characterized by widening at the top of the pattern. This defect is called "post exposure delay" (PED). Another problem with such resists is "footing," which is a widening of the resist pattern close to the substrate that occurs on a basic substrate, particularly a silicon nitride or titanium nitride substrate. The T-top effect is believed to result from a decrease in solubility at the surface of the resist film, and the footing effect at the substrate surface appears to arise from a decline in solubility near the substrate. An additional problem is that acid-labile group elimination is a dark reaction which proceeds during the interval between the exposure step and the PEB step, reducing the final dimensions of the pattern lines. These problems represent major drawbacks to the practical use of chemically amplified resists. Because of such defects, prior-art positive-working chemically amplified resists are difficult to dimensionally control in the lithographic process, and dimensional control is also lost during dry etching of the substrate (see, for example, W. Hinsberg et al., Journal of Photopolymer Science and Technology, Vol. 6, No. 4, 535-546 (1993); and T. Kumada et al., ibid., 571-574).

In positive-working chemically amplified resists, the problems of PED and footing on the substrate surface are believed to be caused in large part by basic compounds which are either airborne or present on the surface of the substrate. The acid at the surface of the resist film that has been generated by exposure reacts with airborne bases and is deactivated. Prolonged standing until post-exposure bake results in a corresponding increase in the amount of deactivated acid, making it more difficult for the acid-labile groups to decompose. A substantially insolubilized layer thus forms at the surface, giving the resist pattern a T-top profile.

It is well-known in the art that the addition of a nitrogen-containing compound can reduce the influence of airborne bases, and is thus effective also against PED (see, for example, JP-A 5-232706, JP-A 5-249683, JP-A 5-158239, JP-A 5-249662, JP-A 5-257282, JP-A 5-289322, JP-A 5-289340, JP-A 6-194834, JP-A 6-242605, JP-A 6-242606, JP-A 6-263716, JP-A 6-263717, JP-A 6-266100, JP-A 6-266111, JP-A 7-128859, JP-A 7-92678, JP-A 7-92680, JP-A 7-92681, JP-A 7-120929 and JP-A 7-134419). General nitrogen-containing compounds having significant effects include amine compounds and amide compounds. Specific examples include pyridine, polyvinylpyridine, aniline, N-methylaniline, N,N-dimethylaniline, o-toluidine, m-toluidine, p-toluidine, 2,4-lutidine, quinoline, isoquinoline, formamide, N-methylformamide, N,N-dimethylformamide, acetamide, N-methylacetamide, N,N-dimethylacetamide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and 2-(p-chlorophenyl)-4,6-trichloromethyl-s-triazine.

These nitrogen-containing compounds are weak bases and can alleviate the T-top problem, but such compounds are unable to control the reaction when highly reactive acid-labile groups are used; that is, they cannot sufficiently control acid diffusion. With the addition of a weak base, the dark reactions in PED in particular proceed in unexposed areas, causing slimming of the line dimensions and a loss of film thickness from the line surface during PED. To overcome such problems, it is desirable to add a strong base. However, a higher basicity is not necessarily better. For example, good results cannot be obtained with the addition of the following super-strong bases: DBU (1,8-diazabicyclo [5.4.0]-7-undecene), DBN (1,5-diazabicyclo[4.3.0]-5-nonene) and proton sponge (1,8-bis(dimethylamino)naphthalene) or quaternary ammonium hydroxides such as tetramethylammonium hydroxide.

The addition of a nitrogen-containing compound having an excellent ability to capture generated acids works well to increase the contrast and thereby achieve a high resolution. The dissociation constants of the acid and base within water can be explained in terms of pKa, but the acid capturing ability within the resist film is not directly related to the pKa of the nitrogen-containing compound. This is discussed by Hatakeyama et al. in Journal of Photopolymer Science and Technology, Vol. 13, No. 4, pp. 519-524 (2000). It is also known that the profile of a pattern are dictated by the property of a nitrogen-containing compound used.

SUMMARY OF THE INVENTION

It is therefore an object of the invention to provide a chemically amplified resist composition which exhibits a high resolution and forms a precisely configured pattern, when processed by photolithography for micropatterning, especially lithography using a light source such as a KrF laser, ArF laser, F₂ laser, extremely short UV, electron beam or x-ray. Another object of the invention is to provide a patterning process which uses the resist composition. A further object of the invention is to provide a novel nitrogen-containing organic compound suited for use in the resist composition.

According to the invention, there is provided a chemically amplified resist composition comprising (A) at least one nitrogen-containing organic compound having an aromatic carboxylic acid ester structure. This resist composition forms a precisely configured pattern.

According to the invention, there is also provided a positive-working chemically amplified resist composition comprising (A) a nitrogen-containing organic compound having an aromatic carboxylic acid ester structure; (B) an organic solvent; (C) a base resin having an acid labile group-protected acidic functional group which is alkali-insoluble or substantially alkali-insoluble, but becomes alkali-soluble when the acid labile group is eliminated; and (D) a photoacid generator. This resist composition forms a precisely configured pattern.

According to the invention, there is also provided a negative-working chemically amplified resist composition comprising (A) a nitrogen-containing organic compound having an aromatic carboxylic acid ester structure; (B) an organic solvent; (C') a base resin which is alkali-soluble, but becomes substantially alkali-insoluble when crosslinked with a crosslinking agent; (D) a photoacid generator; and (E) a crosslinking agent which induces crosslinkage under the action of an acid. This resist composition forms a precisely configured pattern.

In a preferred embodiment, a chemically amplified resist composition comprises at least one nitrogen-containing organic compound having an aromatic carboxylic acid ester structure, represented by the general formula (1).

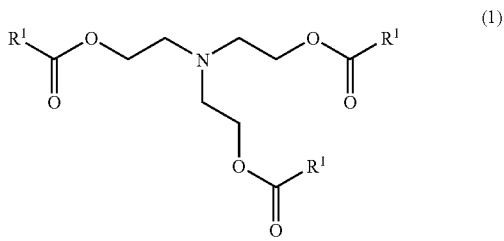

(1)

Herein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_1$-$C_{20}$ aralkyl groups, $C_1$-$C_{10}$ alkoxy groups, $C_1$-$C_{10}$ acyloxy groups or $C_1$-$C_{10}$ alkylthio groups. The chemically amplified resist composition comprising at least one nitrogen-containing organic compound having an aromatic carboxylic acid ester structure, represented by the general formula (1) exhibits a high resolution and forms a precisely configured pattern. For a certain application, a proper choice of $R^1$ enables to optimize resist characteristics including a pattern profile.

In another preferred embodiment, a chemically amplified resist composition comprises at least one nitrogen-containing organic compound having an aromatic carboxylic acid ester structure, represented by the general formula (2).

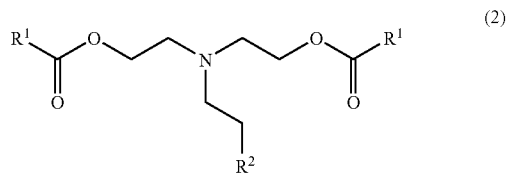

(2)

Herein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^2$ is $CO_2R^3$, $OR^4$ or cyano group; $R^3$ is a $C_1$-$C_{10}$ alkyl group in which at least one methylene moiety may be substituted with an oxygen atom; and $R^4$ is a $C_1$-$C_{10}$ alkyl group or acyl group in which at least one methylene moiety may be substituted with an oxygen atom. The chemically amplified resist composition comprising at least one nitrogen-containing organic compound having an aromatic carboxylic acid ester structure, represented by the general formula (2) exhibits a high resolution and forms a precisely configured pattern. For a certain application, a proper choice of $R^1$ and $R^2$ enables to optimize resist characteristics including a pattern profile.

In a further preferred embodiment, a chemically amplified resist composition comprises at least one nitrogen-containing organic compound having an aromatic carboxylic acid ester structure, represented by the general formula (3).

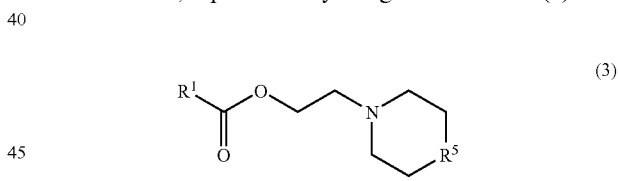

(3)

Herein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^5$ is a single bond, methylene, ethylene, sulfur atom or —$O(CH_2CH_2O)_n$— group; and n is equal to 0, 1, 2, 3 or 4. The chemically amplified resist composition comprising at least one nitrogen-containing organic compound having an aromatic carboxylic acid ester structure, represented by the general formula (3) exhibits a high resolution and forms a precisely configured pattern. For a certain application, a proper choice of $R^1$ and $R^5$ enables to optimize resist characteristics including a pattern profile.

In a still further embodiment, a chemically amplified resist composition comprises at least one nitrogen-containing organic compound having an aromatic carboxylic acid ester structure, represented by the general formula (4).

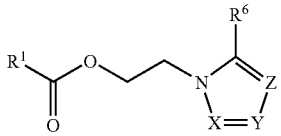
(4)

Herein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^6$ is hydrogen, methyl, ethyl or phenyl; X is a nitrogen atom or $CR^7$; Y is a nitrogen atom or $CR^8$; Z is a nitrogen atom or $CR^9$; $R^7$, $R^8$ and $R^9$ are each independently hydrogen, methyl or phenyl, or $R^7$ and $R^8$, or $R^8$ and $R^9$, taken together, may form a $C_6$-$C_{20}$ aromatic ring or $C_2$-$C_{20}$ hetero-aromatic ring. The chemically amplified resist composition comprising at least one nitrogen-containing organic compound having an aromatic carboxylic acid ester structure, represented by the general formula (4) exhibits a high resolution and forms a precisely configured pattern. For a certain application, a proper choice of $R^1$, $R^6$, X, Y and Z enables to optimize resist characteristics including a pattern profile.

Still further, the present invention provides a patterning process comprising the steps of (1) applying any one of the chemically amplified resist compositions defined above onto a substrate; (2) heat treating the applied resist, then exposing the heat-treated resist through a photomask to high-energy radiation having a wavelength of up to 300 nm or an electron beam; and (3) heat treating the exposed resist, then developing the resist with a developer. The patterning process is successful in forming a resist pattern having a high resolution and satisfactory profile.

In a further aspect, the invention provides a nitrogen-containing organic compound having an aromatic carboxylic acid ester structure, represented by the general formula (1):

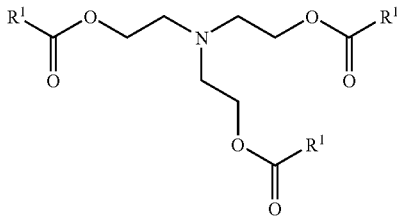
(1)

wherein $R^1$ is as defined above. This compound can be readily prepared in high yields by the method to be described below, and when added in a proper amount, enables to formulate a resist composition which exhibits a high resolution and forms a precisely configured pattern. For a certain application, a proper choice of $R^1$ enables to optimize resist characteristics including a pattern profile.

In a still further aspect, the invention provides a nitrogen-containing organic compound having an aromatic carboxylic acid ester structure, represented by the general formula (2):

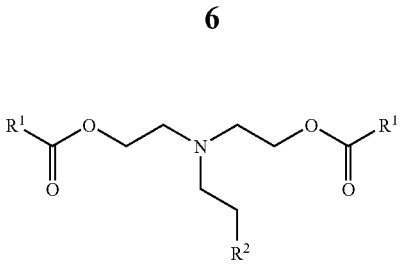
(2)

wherein $R^1$ and $R^2$ are as defined above. This compound can be readily prepared in high yields by the method to be described below, and when added in a proper amount, enables to formulate a resist composition which exhibits a high resolution and forms a precisely configured pattern. For a certain application, a proper choice of $R^1$ and $R^2$ enables to optimize resist characteristics including a pattern profile.

In a still further aspect, the invention provides a nitrogen-containing organic compound having an aromatic carboxylic acid ester structure, represented by the general formula (3):

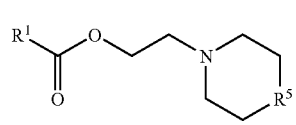
(3)

wherein $R^1$ and $R^5$ are as defined above. This compound can be readily prepared in high yields by the method to be described below, and when added in a proper amount, enables to formulate a resist composition which exhibits a high resolution and forms a precisely configured pattern. For a certain application, a proper choice of $R^1$ and $R^5$ enables to optimize resist characteristics including a pattern profile.

In a still further aspect, the invention provides a nitrogen-containing organic compound having an aromatic carboxylic acid ester structure, represented by the general formula (4):

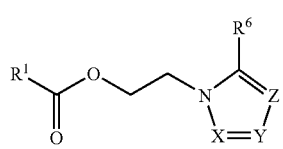
(4)

wherein $R^1$, $R^6$, X, Y and Z are as defined above. This compound can be readily prepared in high yields by the method to be described below, and when added in a proper amount, enables to formulate a resist composition which exhibits a high resolution and forms a precisely configured pattern. For a certain application, a proper choice of $R^1$, $R^6$, X, Y and Z enables to optimize resist characteristics including a pattern profile.

The chemically amplified resist compositions prepared by compounding the nitrogen-containing organic compounds having an aromatic carboxylic acid ester structure exhibit a high resolution, form patterns of good profile, and are useful in lithographic micropatterning using electron beams and deep UV. The nitrogen-containing organic compounds exert best effects when compounded in resists adapted for KrF laser, ArF laser, $F_2$ laser, EUV, EB or x-ray lithography, making the resists ideal as a micropatterning material in VLSI fabrication.

DESCRIPTION OF THE PREFERRED EMBODIMENTS

As used herein, Me stands for methyl, Et for ethyl, Ph for phenyl, and Ac for acetyl.

Nitrogen Compound

The inventors sought for a compound which when compounded in chemically amplified resist compositions, is effective for achieving a high resolution and defining a satisfactory pattern profile. The inventors have discovered that a nitrogen-containing organic compound having an aromatic carboxylic acid ester structure can be combined in proper amounts with a base resin and other components to formulate a chemically amplified photoresist composition which exhibits a high resolution and forms a precisely configured pattern. In particular, nitrogen-containing organic compounds having an aromatic carboxylic acid ester structure, represented by the general formulae (1) to (4), can be readily synthesized in high yields by the method to be described later and exhibit better effects when compounded in resist compositions. When heat treatment prior to exposure, i.e., prebaking is effected at a higher temperature, conventional resist compositions tend to form defectively configured patterns due to increased film slimming, but the resist compositions of the invention overcome such problems and achieve significant improvements. As compared with conventional resist compositions, the resist compositions of the invention are effective for improving the uniformity of pattern feature size and pattern profile in the whole wafer.

The nitrogen-containing compounds to be compounded in chemically amplified resist compositions are preferably nitrogen-containing organic compounds of formulae (1) to (4), as described above, but not limited thereto. Any nitrogen-containing compounds are useful as long as they have an aromatic carboxylic acid ester structure, especially a $R^1$—CO—O— structure.

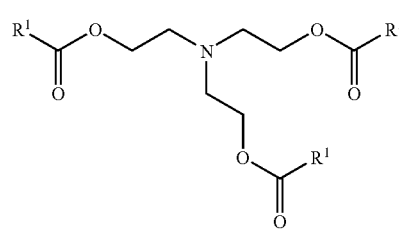

(1)

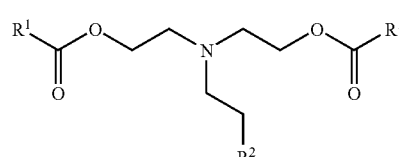

(2)

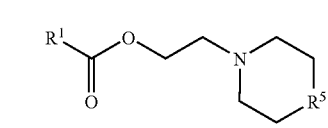

(3)

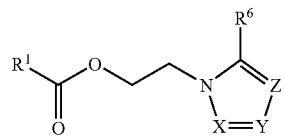

(4)

In formula (1), $R^1$ is a $C_6$-$C_{20}$, especially $C_6$-$C_{14}$, aryl group or a $C_4$-$C_{20}$, especially $C_4$-$C_{12}$, hetero-aromatic group. In these groups, some or all of the hydrogen atoms may be substituted with halogen atoms, straight, branched or cyclic $C_1$-$C_{20}$, especially $C_1$-$C_{10}$, alkyl groups, $C_6$-$C_{20}$, especially $C_6$-$C_{14}$, aryl groups, $C_7$-$C_{20}$, especially $C_7$-$C_{15}$, aralkyl groups, $C_1$-$C_{10}$, especially $C_1$-$C_6$, alkoxy groups, $C_1$-$C_{10}$, especially $C_1$-$C_7$, acyloxy groups or $C_1$-$C_{10}$, especially $C_1$-$C_6$, alkylthio groups. Examples of the aryl group having 6 to 20 carbon atoms include phenyl, naphthyl, anthryl, phenanthryl, pyrenyl, naphthacenyl, and fluorenyl. Examples of the hetero-aromatic groups having 4 to 20 carbon atoms include furyl, thienyl, pyrrolyl, pyridyl, quinolyl, benzofuranyl, isobenzofuranyl, benzothienyl, indolyl, carbazolyl, pyranyl, benzopyranyl, acridinyl, thianthrenyl, and phenoxthinyl. Examples of straight, branched or cyclic alkyl groups having 1 to 20 carbon atoms include methyl, ethyl, propyl, isopropyl, butyl, isobutyl, t-butyl, pentyl, hexyl, decyl, cyclopentyl, cyclohexyl, and decahydronaphthalenyl. Examples of aralkyl groups having 7 to 20 carbon atoms include benzyl, phenethyl, phenylpropyl, naphthylmethyl, naphthylethyl, and anthracenylmethyl. Examples of alkoxy groups having 1 to 10 carbon atoms include methoxy, ethoxy, propoxy, isopropoxy, butoxy, isobutoxy, t-butoxy, t-amyloxy, decyloxy, cyclohexyloxy, and cyclopentyloxy. Examples of acyloxy groups having 1 to 10 carbon atoms include formyloxy, acetoxy, propionyloxy, butyryloxy, pivaloyloxy, cyclohexanecarbonyloxy, and decanoyloxy. Examples of alkylthio groups having 1 to 10 carbon atoms include methylthio, ethylthio, propylthio, isopropylthio, butylthio, isobutylthio, t-butylthio, t-amylthio, decylthio, and cyclohexylthio. Examples are not limited to the foregoing.

Illustrative, non-limiting examples of the nitrogen-containing organic compound having formula (1) are given below.

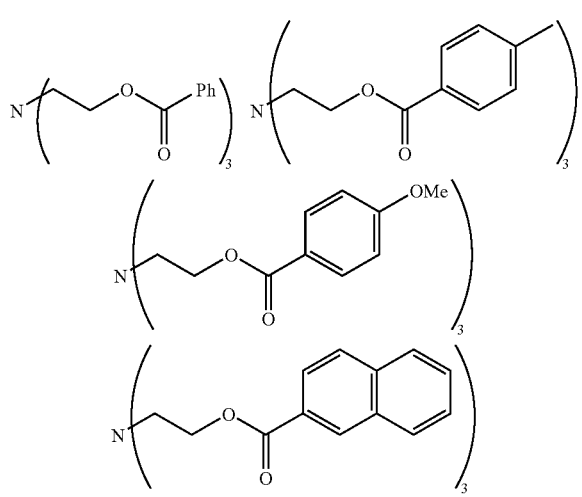

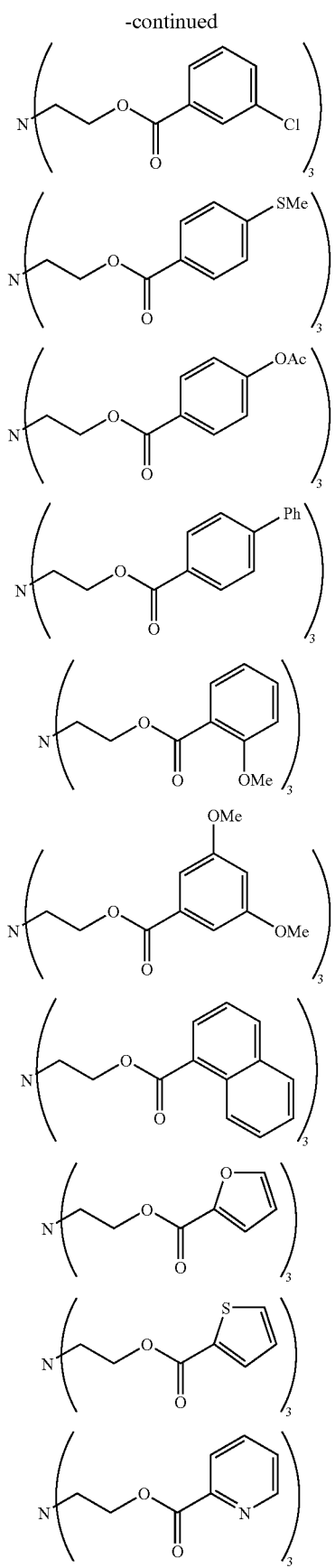
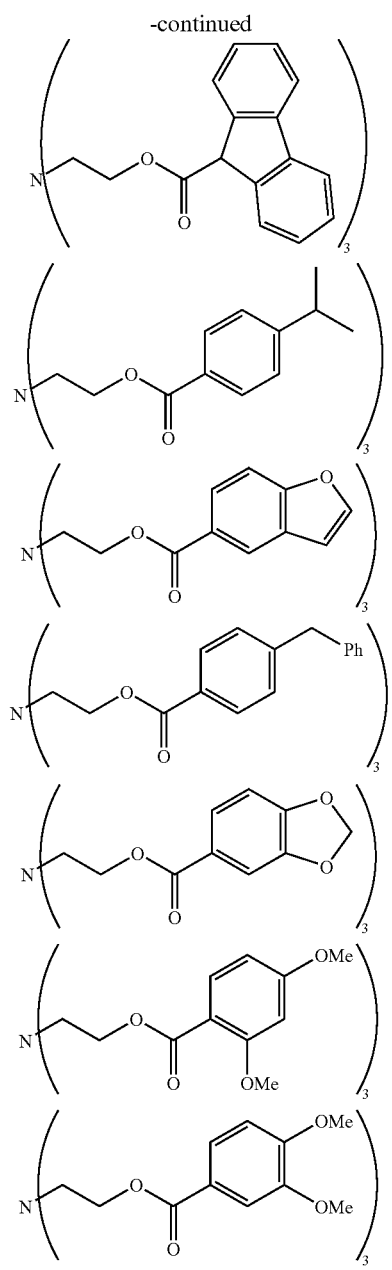

In formula (2), $R^1$ is as defined above. $R^2$ is $CO_2R^3$, $OR^4$ or cyano group. $R^3$ is a $C_1$-$C_{10}$ alkyl group in which at least one methylene moiety may be substituted with an oxygen atom. $R^4$ is a $C_1$-$C_{10}$ alkyl group or acyl group in which at least one methylene moiety may be substituted with an oxygen atom. Non-limiting examples of the $C_1$-$C_{10}$ alkyl group in which at least one methylene moiety may be substituted with an oxygen atom, represented by $R^3$ and $R^4$, include methyl, ethyl, propyl, isopropyl, butyl, isobutyl, t-butyl, pentyl, hexyl, decyl, cyclopentyl, cyclohexyl, decahydronaphthalenyl, methoxymethyl, methoxyethyl, (methoxyethoxy)ethyl, furanyl, tetrahydrofuranyl, methoxyethoxymethyl, and tetrahydropyranyl. Non-limiting examples of the acyl group in which at least one methylene moiety may be substituted with an oxygen atom, represented by $R^4$, include formyl, acetyl, propionyl, butyryl, isobutyryl, pivaloyl, valeryl, hexanoyl, decanoyl, methoxyacetyl, methoxyethoxyacetyl, methoxyethoxyethoxyacetyl, and cyclohexanecarboxyl.

Illustrative, non-limiting examples of the nitrogen-containing organic compound having formula (2) are given below.

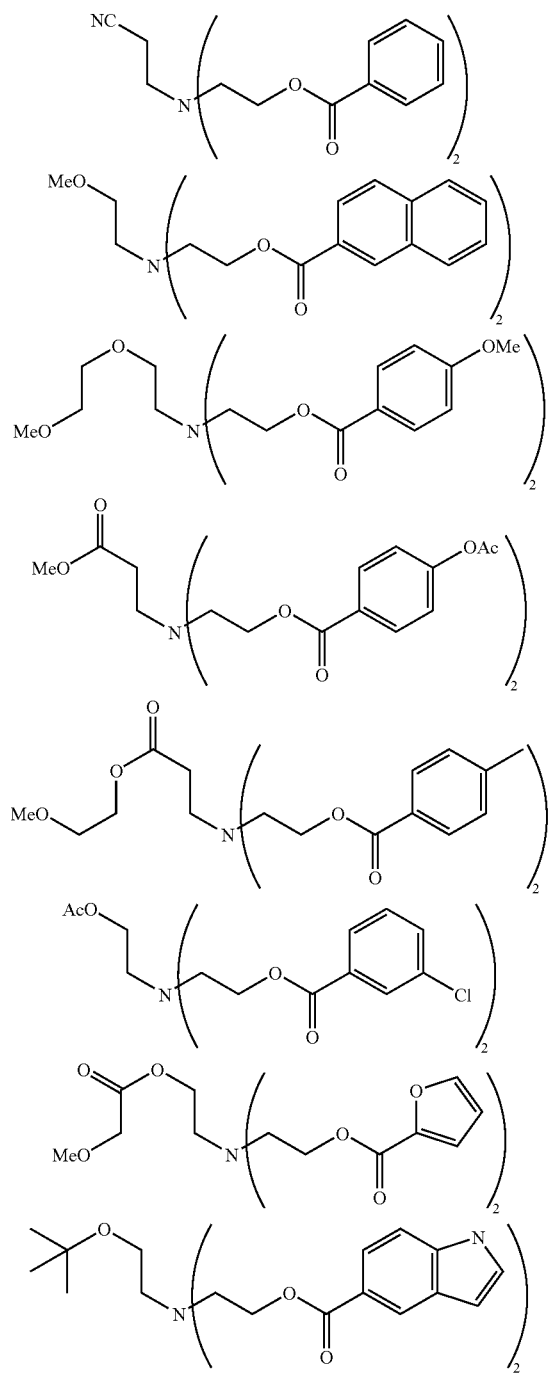

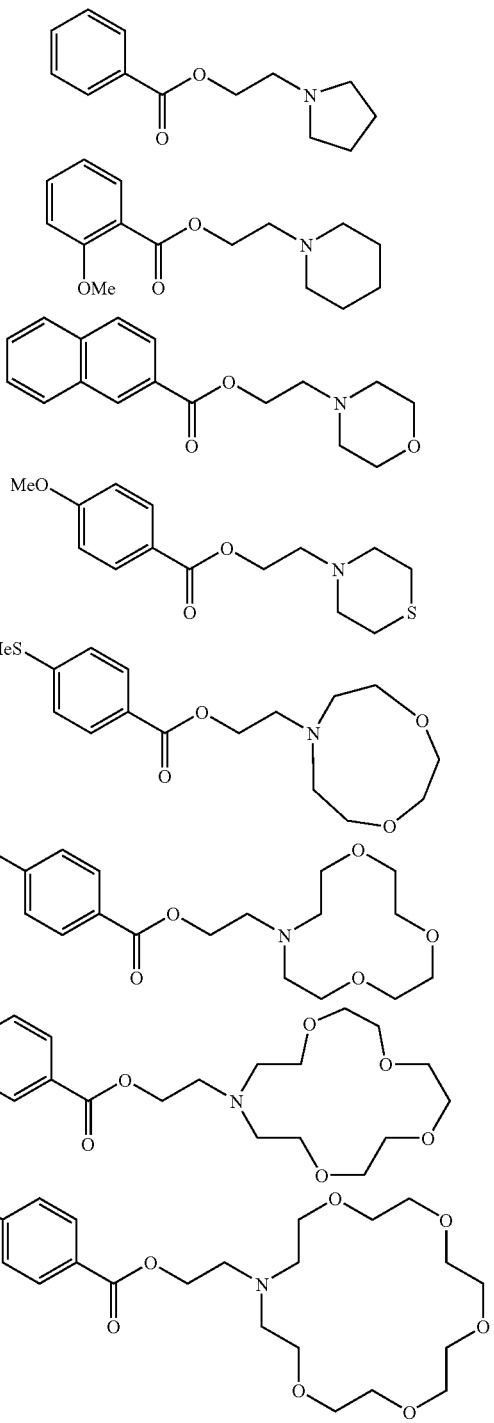

In formula (3), $R^1$ is as defined above. $R^5$ is a single bond, methylene, ethylene, sulfur atom or $-O(CH_2CH_2O)_n-$ group; and n is equal to 0, 1, 2, 3 or 4. Illustrative, non-limiting examples of the nitrogen-containing organic compound having formula (3) are given below.

In formula (4), $R^1$ is as defined above. $R^6$ is hydrogen, methyl, ethyl or phenyl. X is a nitrogen atom or $CR^7$. Y is a nitrogen atom or $CR^8$. Z is a nitrogen atom or $CR^9$. $R^7$, $R^8$ and $R^9$ are each independently hydrogen, methyl or phenyl. Alternatively, a pair of $R^7$ and $R^8$, or a pair of $R^8$ and $R^9$, taken together, may form a $C_6$-$C_{20}$ aromatic ring or $C_2$-$C_{20}$ hetero-aromatic ring. Examples of the $C_6$-$C_{20}$ aromatic ring formed by a pair of $R^7$ and $R^8$ or $R^8$ and $R^9$ include, but are not limited to, benzene, naphthalene, anthracene, phenanthrene, and fluorene rings. Examples of the $C_2$-$C_{20}$ hetero-aromatic ring formed by a pair of $R^7$ and $R^8$ or $R^8$ and $R^9$ include, but are not limited to, furan, thiophene, pyrrole, triazole, pyrazole, imidazole, pyridine, benzofuran, benzothiophene, indole, oxazole, and quinoline rings. Illustrative, non-limiting examples of the nitrogen-containing organic compound having formula (4) are given below.
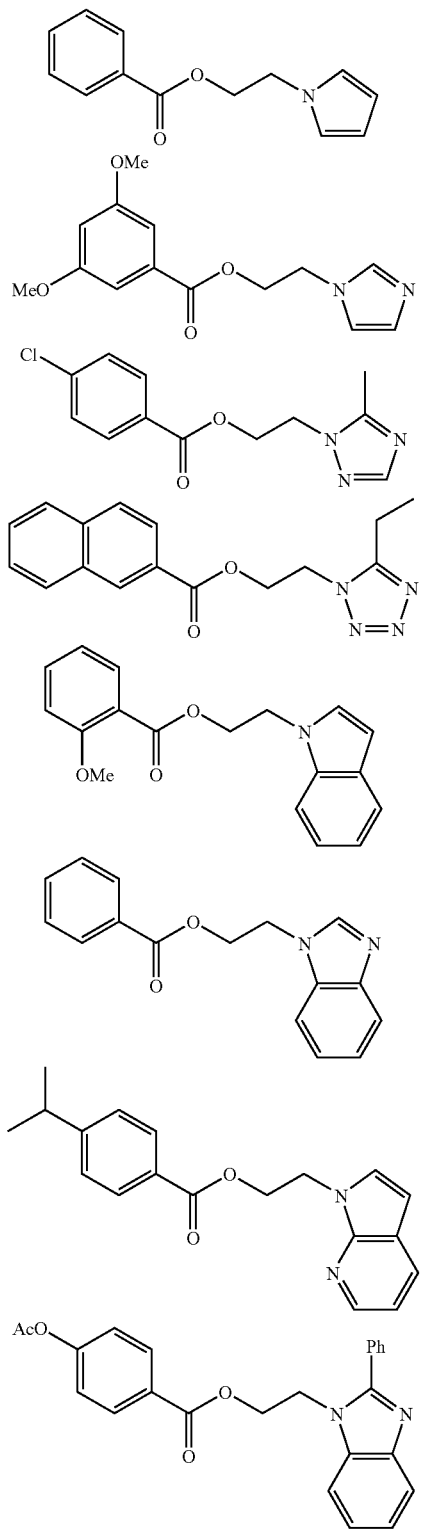
-continued
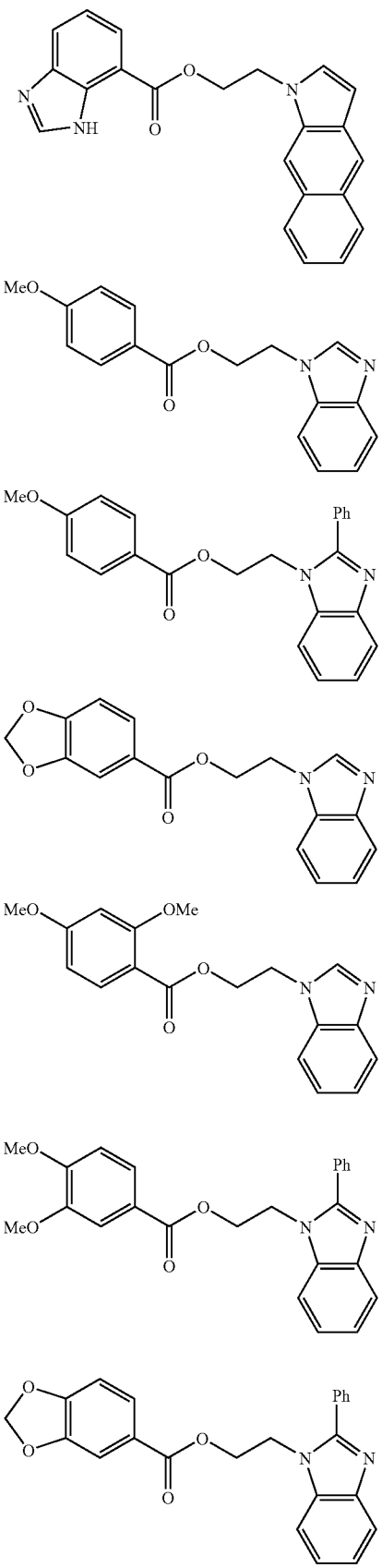

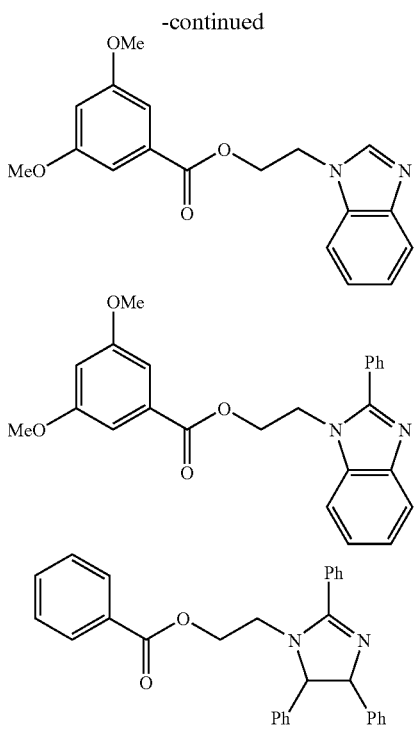

Illustrative, non-limiting examples of the nitrogen-containing organic compounds having an aromatic carboxylic acid ester structure, other than the nitrogen-containing organic compounds having formulae (1) to (4), which can be compounded in the resist compositions of the invention are given below.

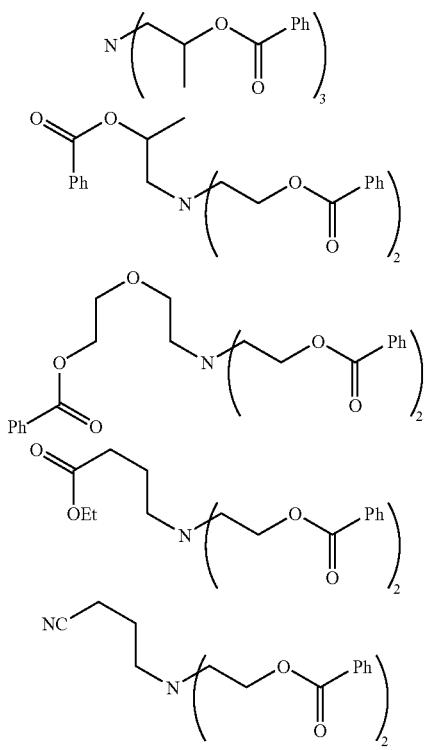

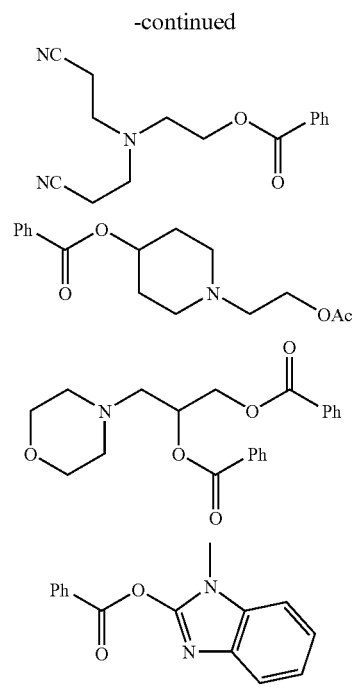

According to the invention, the nitrogen-containing organic compounds have an aromatic carboxylic acid ester structure within their molecule. It is believed that the presence of the ester group having a high affinity to acids enables generated acids to be rapidly captured, and the presence of the aromatic carboxylic acid ester structure within the molecule affects the distribution of the nitrogen-containing organic compound in the resist film. As a result, the photoresist composition containing the nitrogen-containing organic compound is endowed with a high resolution and a excellent pattern profile. By selecting for a certain application an optimal structure compound from among many possible nitrogen-containing organic compounds having an aromatic carboxylic acid ester structure according to the invention, the volatility, basicity, and acid capturing rate of the nitrogen-containing organic compound and the acid diffusion rate within the resist can be suitably adjusted so as to comply with a particular combination of the resist polymer with the photoacid generator. This eventually enables to adjust resist material characteristics such as pattern profile.

The nitrogen-containing organic compounds of formulae (1) to (4) are novel. They are prepared by an optimum method that is selected in accordance with the structure of the compound. Typical methods include esterification of nitrogen-containing alcohol compounds and N-alkylation of nitrogen-containing compounds, but are not limited to these. These typical methods are described below in detail.

The first method is to produce nitrogen-containing organic compounds through esterification of nitrogen-containing alcohol compounds. This method is applicable to the synthesis of all the compounds having formulae (1) to (4), as shown by the following reaction schemes.

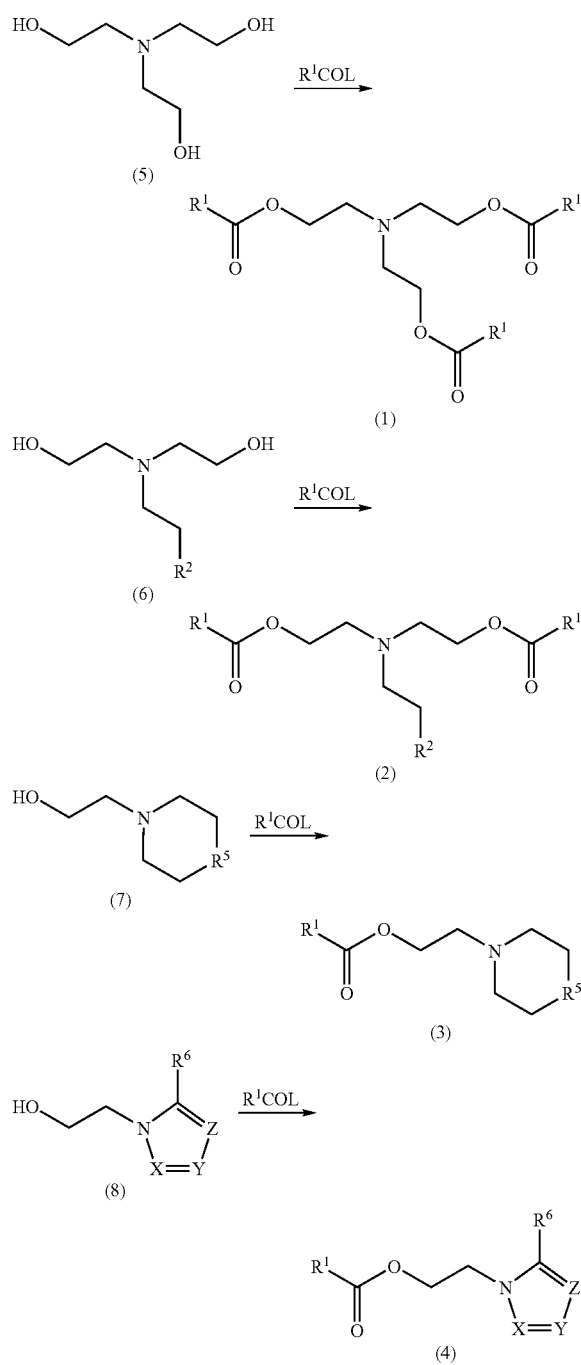

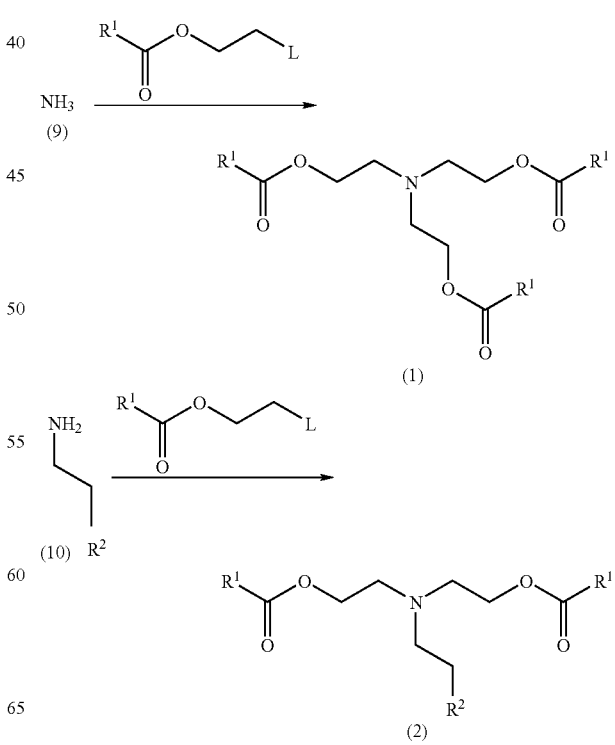

As described previously, $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^2$ is $CO_2R^3$, $OR^4$ or cyano group; $R^3$ is a $C_1$-$C_{10}$ alkyl group in which at least one methylene moiety may be substituted with an oxygen atom; $R^4$ is a $C_1$-$C_{10}$ alkyl group or acyl group in which at least one methylene moiety may be substituted with an oxygen atom; $R^5$ is a single bond, methylene, ethylene, sulfur atom or —O(CH$_2$CH$_2$O)$_n$— group; n is equal to 0, 1, 2, 3 or 4; $R^6$ is hydrogen, methyl, ethyl or phenyl; X is a nitrogen atom or $CR^7$; Y is a nitrogen atom or $CR^8$; Z is a nitrogen atom or $CR^9$; $R^7$, $R^8$ and $R^9$ are each independently hydrogen, methyl or phenyl, or $R^7$ and $R^8$, or $R^8$ and $R^9$, taken together, may form a $C_6$-$C_{20}$ aromatic ring or $C_2$-$C_{20}$ hetero-aromatic ring. L is a monovalent organic group.

When L in the formula: $R^1COL$ is a leaving group such as a halogen atom, acyloxy group, alkylsulfonyloxy group or aryloxy group, the relevant reaction is acylation reaction of an alcohol using an acylating agent, which reaction may be conducted in accordance with a customary procedure as used for base-promoted acylation. When L in the formula is —OH, the relevant reaction is esterification reaction using an alcohol and a carboxylic acid, which reaction may be conducted in accordance with a customary procedure as used for acid-promoted esterification. When L in the formula is —OR wherein R is alkyl, the relevant reaction is trans-esterification reaction using an alcohol and a carboxylic acid ester, which reaction may be conducted in accordance with a customary procedure as used for transesterification catalyzed by base or Lewis acid. Following the reaction, the target compound, i.e., nitrogen-containing organic compound is isolated from the reaction mixture by a conventional aqueous work-up. If necessary, the target compound can be purified by an ordinary method such as distillation, chromatography or recrystallization. Alternatively, the reaction mixture may be directly subjected to purification without aqueous work-up.

The second method is to produce nitrogen-containing organic compounds through alkylation of nitrogen-containing compounds. This method is also applicable to the synthesis of all the compounds having formulae (1) to (4), as shown by the following reaction schemes.

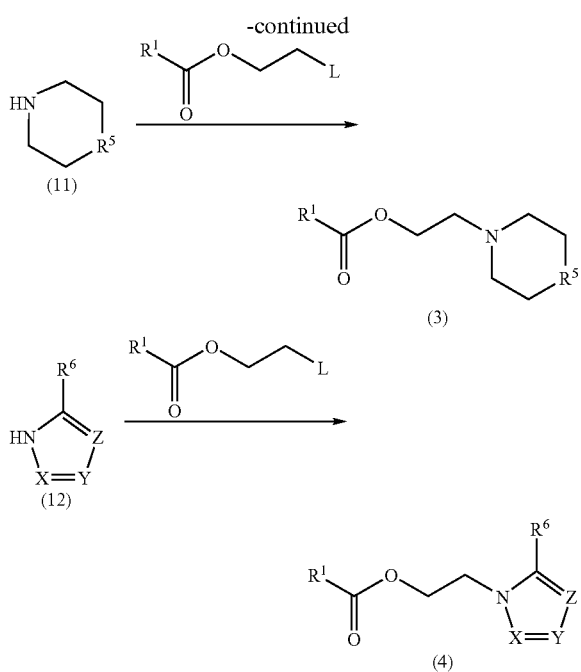

As described previously, $R^1$ is a $C_6$-$C_{20}$, aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$, aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^2$ is $CO_2R^3$, $OR^4$ or cyano group; $R^3$ is a $C_1$-$C_{10}$ alkyl group in which at least one methylene moiety may be substituted with an oxygen atom; $R^4$ is a $C_1$-$C_{10}$ alkyl group or acyl group in which at least one methylene moiety may be substituted with an oxygen atom; $R^5$ is a single bond, methylene, ethylene, sulfur atom or —$O(CH_2CH_2O)_n$— group; n is equal to 0, 1, 2, 3 or 4; $R^6$ is hydrogen, methyl, ethyl or phenyl; X is a nitrogen atom or $CR^7$; Y is a nitrogen atom or $CR^8$; Z is a nitrogen atom or $CR^9$; $R^7$, $R^8$ and $R^9$ are each independently hydrogen, methyl or phenyl, or $R^7$ and $R^8$, or $R^8$ and $R^9$, taken together, may form a $C_6$-$C_{20}$ aromatic ring or $C_2$-$C_{20}$ hetero-aromatic ring. L is a leaving group.

L in the formula is a leaving group such as a halogen atom, alkylsulfonyloxy group or arylsulfonyloxy group. Thus the relevant reaction is N-alkylation reaction using a nitrogen-containing compound and an alkylating agent, which reaction may be conducted in accordance with a customary procedure as used for N-alkylation in the presence of base catalysts. Following the reaction, the target compound, i.e., nitrogen-containing organic compound is isolated from the reaction mixture by a conventional aqueous work-up. If necessary, the target compound can be purified by an ordinary method such as distillation, chromatography or recrystallization. Alternatively, the reaction mixture may be directly subjected to purification without aqueous work-up.

Resist Composition

As previously described, the nitrogen-containing organic compound of the invention is effective as a basic compound component to be formulated in a chemically amplified resist composition. The chemically amplified resist composition may be either positive or negative working. The chemically amplified resist composition of the invention is typically defined as comprising (A) a nitrogen-containing organic compound having an aromatic carboxylic acid ester structure as described above,
(B) an organic solvent,
(C) a base resin, and
(D) a photoacid generator.

In one embodiment wherein the resist composition is positive, component (C) is a base resin having an acid labile group-protected acidic functional group, which is alkali-insoluble or substantially alkali-insoluble, but becomes alkali-soluble when the acid labile group is eliminated. In another embodiment wherein the resist composition is negative, the composition further includes a crosslinking agent (E), and component (C) is a base resin which is alkali-soluble, but becomes substantially alkali-insoluble when crosslinked with the crosslinking agent (E).

In the inventive resist composition, an appropriate amount of the nitrogen-containing organic compound (A) compounded is 0.01 to 2 parts by weight, desirably 0.01 to 1 parts by weight per 100 parts by weight of the base resin (C). Outside the range, less amounts of the nitrogen-containing compound may fail to achieve the desired effect whereas larger amounts may lower the sensitivity of the resist.

Organic Solvent B

The organic solvent used herein may be any organic solvent in which the base resin, photoacid generator, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as y-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the photoacid generator is most soluble therein.

An appropriate amount of the organic solvent used is about 200 to 1,000 parts, especially about 400 to 800 parts by weight per 100 parts by weight of the base resin.

Base Polymer C

The base polymers used as component (C) in the inventive compositions include polyhydroxystyrene (PHS), and copolymers of hydroxystyrene with styrene, (meth)acrylic acid esters or other polymerizable olefinic compounds, for KrF excimer laser resist use; (meth)acrylic acid ester polymers, alternating copolymers of cycloolefin with maleic anhydride, copolymers further containing vinyl ethers or (meth)acrylic acid esters, polynorbornene, and ring-opening metathesis polymerized cycloolefins, for ArF excimer laser resist use; and fluorinated forms of the foregoing polymers (for both KrF and ArF laser uses) and polymers resulting from ring-closure polymerization using fluorinated dienes for $F_2$ excimer laser resist use. Silicon-substituted forms of the foregoing polymers and polysilsesquioxane polymers are useful for the bilayer resists. The base resin is not limited to the polymers of these systems. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

The acid labile groups to be introduced into the base polymers may be selected from a variety of such groups, preferably from acetal groups of 2 to 30 carbon atoms and tertiary alkyl groups of 4 to 30 carbon atoms having the formulae (C1) and (C2), respectively.

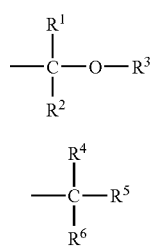

In formulae (C1) and (C2), $R^1$ and $R^2$ each are hydrogen or a straight, branched or cyclic alkyl group of 1 to 20 carbon atoms, preferably 1 to 12 carbon atoms, which may contain a hetero atom such as oxygen, sulfur, nitrogen or fluorine, $R^3$, $R^4$, $R^5$ and $R^6$ each are a straight, branched or cyclic alkyl group of 1 to 20 carbon atoms, preferably 1 to 12 carbon atoms, an aryl group or an aralkyl group, which may contain a hetero atom such as oxygen, sulfur, nitrogen or fluorine. A pair of $R^1$ and $R^2$, a pair of $R^1$ and $R^3$, a pair of $R^2$ and $R^3$, a pair of $R^4$ and $R^5$, a pair of $R^4$ and $R^6$, or a pair of $R^5$ and $R^6$, taken together, may form a ring of 3 to 20 carbon atoms, preferably 3 to 12 carbon atoms, with the carbon or oxygen atom to which they are attached.

Illustrative examples of the acetal group of formula (C1) include, but are not limited to, methoxymethyl, ethoxymethyl, propoxymethyl, butoxymethyl, isopropoxymethyl, t-butoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (C2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydrogen atoms of hydroxyl groups may be substituted with acid labile groups of the following general formula (C3a) or (C3b) for crosslinkage between molecules or within a molecule.

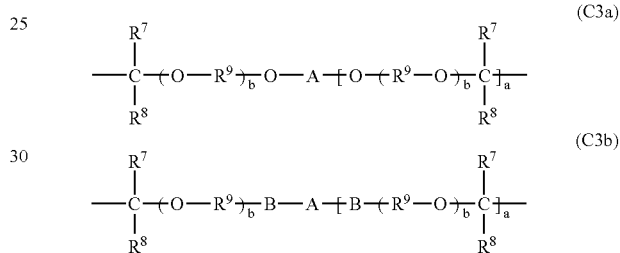

Herein, $R^7$ and $R^8$ each are hydrogen or a straight, branched or cyclic alkyl group of 1 to 8 carbon atoms, or $R^7$ and $R^8$, taken together, may form a ring, with the proviso that each of $R^7$ and $R^8$ is a straight or branched alkylene group of 1 to 8 carbon atoms when they form a ring. $R^9$ is a straight, branched or cyclic alkylene group of 1 to 10 carbon atoms. Letter "a" is an integer of 1 to 7, and "b" is 0 or an integer of 1 to 10. "A" is a (a+1)-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, carbonyl group or fluorine atom. B is —CO—O—, —NHCO—O— or —NHCONH—.

Illustrative examples of the crosslinking acetal linkages represented by formulae (C3a) and (C3b) are given below as (C3)-1 through (C3)-8, but not limited thereto.

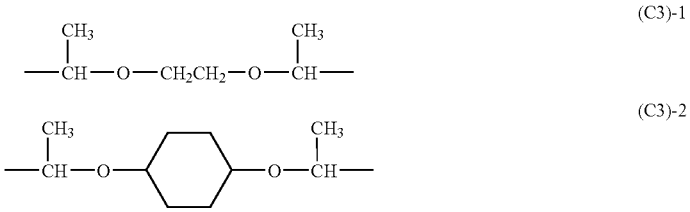

-continued

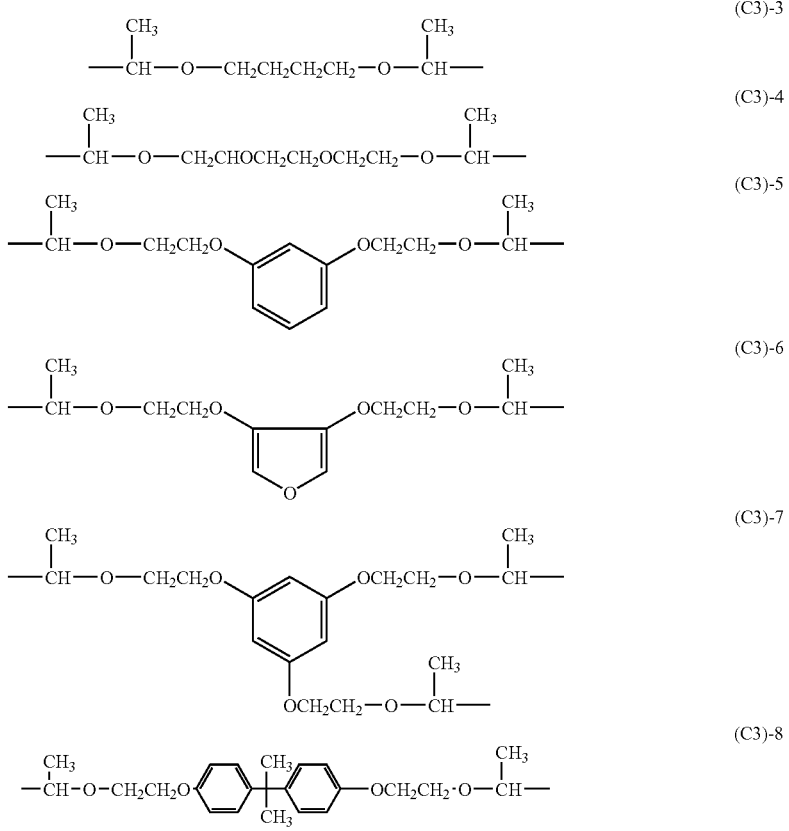

Preferably the base polymer has a weight average molecular weight (Mw) of 2,000 to 100,000. With Mw below 2,000, film formation and resolution may become poor. With Mw beyond 100,000, resolution may become poor or foreign matter may generate during pattern formation. Note that the Mw is determined by gel permeation chromatography (GPC) using polystyrene standards.

Photoacid Generator D

The resist composition further contains (D) a compound capable of generating an acid upon exposure to high energy radiation, that is, a photoacid generator. Suitable photoacid generators include sulfonium salts, iodonium salts, sulfonyldiazomethane and N-sulfonyloxyimide photoacid generators. Exemplary photoacid generators are given below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, hydroquinone, in which all the hydroxyl groups are substituted with trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is substituted with a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)-phenylacetonitrile, (5-(10-camphorsulfonyl)oxyimino-5H-thiophen-2-ylidene)-phenylacetonitrile, (5-n-octanesulfonyloxyimino-5H-thiophen-2-ylidene)-phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example, 2,2,2-trifluoro-1-phenyl-ethanone oxime-O-methylsulfonate;

2,2,2-trifluoro-1-phenyl-ethanone oxime-O-(10-camphorylsulfonate);

2,2,2-trifluoro-1-phenyl-ethanone oxime-O-(4-methoxyphenylsulfonate);

2,2,2-trifluoro-1-phenyl-ethanone oxime-O-(1-naphthylsulfonate);

2,2,2-trifluoro-1-phenyl-ethanone oxime-O-(2-naphthylsulfonate);

2,2,2-trifluoro-1-phenyl-ethanone oxime-O-(2,4,6-trimethylphenylsulfonate);

2,2,2-trifluoro-1-(4-methylphenyl)-ethanone oxime-O-(10-camphorylsulfonate);

2,2,2-trifluoro-1-(4-methylphenyl)-ethanone oxime-O-(methylsulfonate);

2,2,2-trifluoro-1-(2-methylphenyl)-ethanone oxime-O-(10-camphorylsulfonate);

2,2,2-trifluoro-1-(2,4-dimethylphenyl)-ethanone oxime-O-(10-camphorylsulfonate);

2,2,2-trifluoro-1-(2,4-dimethylphenyl)-ethanone oxime-O-(1-naphthylsulfonate);

2,2,2-trifluoro-1-(2,4-dimethylphenyl)-ethanone oxime-O-(2-naphthylsulfonate);

2,2,2-trifluoro-1-(2,4,6-trimethylphenyl)-ethanone oxime-O-(10-camphorylsulfonate);

2,2,2-trifluoro-1-(2,4,6-trimethylphenyl)-ethanone oxime-O-(1-naphthylsulfonate);

2,2,2-trifluoro-1-(2,4,6-trimethylphenyl)-ethanone oxime-O-(2-naphthylsulfonate);

2,2,2-trifluoro-1-(4-methoxyphenyl)-ethanone oxime-O-methylsulfonate;

2,2,2-trifluoro-1-(4-methylthiophenyl)-ethanone oxime-O-methylsulfonate;

2,2,2-trifluoro-1-(3,4-dimethoxyphenyl)-ethanone oxime-O-methylsulfonate;

2,2,3,3,4,4,4-heptafluoro-1-phenyl-butanone oxime-O-(10-camphorylsulfonate);

2,2,2-trifluoro-1-(phenyl)-ethanone oxime-O-methylsulfonate;

2,2,2-trifluoro-1-(phenyl)-ethanone oxime-O-10-camphorylsulfonate;

2,2,2-trifluoro-1-(phenyl)-ethanone oxime-O-(4-methoxyphenyl)sulfonate;

2,2,2-trifluoro-1-(phenyl)-ethanone oxime-O-(1-naphthyl)sulfonate;

2,2,2-trifluoro-1-(phenyl)-ethanone oxime-O-(2-naphthyl)sulfonate;

2,2,2-trifluoro-1-(phenyl)-ethanone oxime-O-(2,4,6-trimethylphenyl)sulfonate;

2,2,2-trifluoro-1-(4-methylphenyl)-ethanone oxime-O-(10-camphoryl)sulfonate;

2,2,2-trifluoro-1-(4-methylphenyl)-ethanone oxime-O-methylsulfonate;

2,2,2-trifluoro-1-(2-methylphenyl)-ethanone oxime-O-(10-camphoryl)sulfonate;

2,2,2-trifluoro-1-(2,4-dimethylphenyl)-ethanone oxime-O-(1-naphthyl)sulfonate;

2,2,2-trifluoro-1-(2,4-dimethylphenyl)-ethanone oxime-O-(2-naphthyl)sulfonate;

2,2,2-trifluoro-1-(2,4,6-trimethylphenyl)-ethanone oxime-O-(10-camphoryl)sulfonate;

2,2,2-trifluoro-1-(2,4,6-trimethylphenyl)-ethanone oxime-O-(1-naphthyl)sulfonate;

2,2,2-trifluoro-1-(2,4,6-trimethylphenyl)-ethanone oxime-O-(2-naphthyl)sulfonate;

2,2,2-trifluoro-1-(4-methoxyphenyl)-ethanone oxime-O-methylsulfonate;

2,2,2-trifluoro-1-(4-thiomethylphenyl)-ethanone oxime-O-methylsulfonate;

2,2,2-trifluoro-1-(3,4-dimethoxyphenyl)-ethanone oxime-O-methylsulfonate;

2,2,2-trifluoro-1-(4-methoxyphenyl)-ethanone oxime-O-(4-methylphenyl)sulfonate;

2,2,2-trifluoro-1-(4-methoxyphenyl)-ethanone oxime-O-(4-methoxyphenyl)sulfonate;

2,2,2-trifluoro-1-(4-methoxyphenyl)-ethanone oxime-O-(4-dodecylphenyl)sulfonate;

2,2,2-trifluoro-1-(4-methoxyphenyl)-ethanone oxime-O-octylsulfonate;

2,2,2-trifluoro-1-(4-thiomethylphenyl)-ethanone oxime-O-(4-methoxyphenyl)sulfonate;

2,2,2-trifluoro-1-(4-thiomethylphenyl)-ethanone oxime-O-(4-dodecylphenyl)sulfonate;

2,2,2-trifluoro-1-(4-thiomethylphenyl)-ethanone oxime-O-octylsulfonate;

2,2,2-trifluoro-1-(4-thiomethylphenyl)-ethanone oxime-O-(2-naphthyl)sulfonate;

2,2,2-trifluoro-1-(2-methylphenyl)-ethanone oxime-O-methylsulfonate;

2,2,2-trifluoro-1-(4-methylphenyl)ethanone oxime-O-phenylsulfonate;

2,2,2-trifluoro-1-(4-chlorophenyl)-ethanone oxime-O-phenylsulfonate;

2,2,3,3,4,4,4-heptafluoro-1-(phenyl)-butanone oxime-O-(10-camphoryl)sulfonate;

2,2,2-trifluoro-1-naphthyl-ethanone oxime-O-methylsulfonate;

2,2,2-trifluoro-2-naphthyl-ethanone oxime-O-methylsulfonate;

2,2,2-trifluoro-1-[4-benzylphenyl]-ethanone oxime-O-methylsulfonate;

2,2,2-trifluoro-1-[4-(phenyl-1,4-dioxa-but-1-yl)phenyl]-ethanone oxime-O-methylsulfonate;

2,2,2-trifluoro-1-naphthyl-ethanone oxime-O-propylsulfonate;

2,2,2-trifluoro-2-naphthyl-ethanone oxime-O-propylsulfonate;

2,2,2-trifluoro-1-[4-benzylphenyl]-ethanone oxime-O-propylsulfonate;

2,2,2-trifluoro-1-[4-methylsulfonylphenyl]-ethanone oxime-O-propylsulfonate;

1,3-bis[1-(4-phenoxyphenyl)-2,2,2-trifluoroethanone oxime-O-sulfonyl]phenyl;

2,2,2-trifluoro-1-[4-methylsulfonyloxyphenyl]-ethanone oxime-O-propylsulfonate;

2,2,2-trifluoro-1-[4-methylcarbonyloxyphenyl]-ethanone oxime-O-propylsulfonate;

2,2,2-trifluoro-1-[6H,7H-5,8-dioxonaphth-2-yl]-ethanone oxime-O-propylsulfonate;

2,2,2-trifluoro-1-[4-methoxycarbonylmethoxyphenyl]-ethanone oxime-O-propylsulfonate;

2,2,2-trifluoro-1-[4-(methoxycarbonyl)-(4-amino-1-oxapent-1-yl)-phenyl]-ethanone oxime-O-propylsulfonate;

2,2,2-trifluoro-1-[3,5-dimethyl-4-ethoxyphenyl]-ethanone oxime-O-propylsulfonate;

2,2,2-trifluoro-1-[4-benzyloxyphenyl]-ethanone oxime-O-propylsulfonate;

2,2,2-trifluoro-1-[2-thiophenyl]-ethanone oxime-O-propylsulfonate; and 2,2,2-trifluoro-1-[1-dioxa-thiophen-2-yl)]-ethanone oxime-O-propylsulfonate.

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]-acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Suitable bisoxime sulfonates include those described in JP-A 9-208554, for example, bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylene-diacetonitrile, etc.

Of these, preferred photoacid generators are sulfonium salts, bissulfonyldiazomethanes, N-sulfonyloxyimides and glyoxime derivatives. More preferred photoacid generators are sulfonium salts, bissulfonyldiazomethanes, and N-sulfonyloxyimides. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluene-sulfonyloxy)benzenesulfonate, tris(4-methylphenyl)sulfonium camphorsulfonate, tris(4-tert-butylphenyl)sulfonium camphorsulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, and N-p-toluenesulfonyloxy-5-norbornene-2,3-dicarboxylic acid imide.

In the chemically amplified resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate an acid, that is, acid amplifier. For these compounds, reference should be made to J. Photopolym. Sci. and Tech., 8, 43-44, 45-46 (1995), and ibid., 9, 29-30 (1996).

Examples of the acid amplifier include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid amplifier is up to 2 parts, and especially up to 1 part by weight per 100 parts by weight of the base resin. Excessive amounts of the acid amplifier make diffusion control difficult, leading to degradation of resolution and pattern configuration.

Crosslinker E

Formulated in the negative resist composition is a crosslinker (E) which forms a crosslinked structure under the action of acid. Typical crosslinkers are compounds having at least two hydroxymethyl, alkoxymethyl, epoxy or vinyl ether groups within a molecule. Substituted glycoluril derivatives, urea derivatives, and hexa(methoxymethyl) melamine compounds are suitable as the crosslinker. Examples include N,N,N',N'-tetramethoxymethylurea, hexamethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2',6,6'-tetrahydroxymethyl-bisphenol A, 1,4-bis[2-(2-hydroxypropyl)]benzene, N,N,N',N'-tetramethoxymethylurea, and hexamethoxymethylmelamine. In the resist composition, an appropriate amount of the crosslinker is, though not limited thereto, about 1 to 25 parts, and especially about 5 to 20 parts by weight per 100 parts by weight of the base resin. The crosslinkers may be used alone or in admixture of two or more.

In addition to the inventive nitrogen-containing organic compound, one or more of commonly used nitrogen-containing organic compounds may be employed in the inventive resist composition.

In addition to the above components, the inventive resist composition may optionally include known additives such as dissolution regulators, surfactants, acidic compounds, dyes, thermal crosslinkers and stabilizers.

Pattern formation using the resist composition of the invention may be carried out by a known lithographic technique. For example, the resist composition may be applied onto a substrate such as a silicon wafer by spin coating or the like to form a resist film having a thickness of 0.05 to 2.0 μm, which is then pre-baked on a hot plate at 60 to 150° C. for 0.1 to 10 minutes, and preferably at 80 to 140° C. for 0.5 to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$. The resist film may be exposed by a conventional exposure process or in some cases, by an immersion process of filling the space between the mask and the resist with liquid. The resist film is then post-exposure baked (PEB) on a hot plate at 60 to 150° C. for 0.1 to 5 minutes, preferably at 80 to 140° C. for 0.5 to 3 minutes. Finally, development may be carried out using as the developer an aqueous alkali solution, such as 0.1 to 5 wt %, preferably 2 to 3 wt %, tetramethylammonium hydroxide (TMAH), by a conventional method such as dipping, puddling, or spraying for a period of 0.1 to 3 minutes, preferably 0.5 to 2 minutes. These steps result in the formation of the desired pattern on the substrate. If necessary, the pattern as developed can be heat treated for adjusting the pattern size (known as the thermal flow process).

Of the various types of high-energy radiation that may be used, the resist composition of the invention is best suited to micro-pattern formation with, in particular, deep-UV rays having a wavelength of 250 to 120 nm or excimer laser beams, extremely short UV, x-rays or electron beams.

EXAMPLE

Examples of the invention are given below by way of illustration and not by way of limitation. The meaning of abbreviations is Me for methyl, Ph for phenyl, and t-Bu for tert-butyl.

Synthesis Examples

Nitrogen-containing organic compounds within the scope of the invention were synthesized by the method described below.

Synthesis Example 1

Synthesis of nitrilotriethane-2,1-diyl tribenzoate (Amine 1)

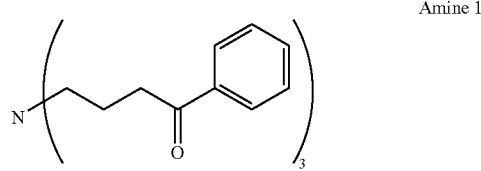

Amine 1

To a mixture of 149 g of triethanolamine, 405 g of triethylamine, and 1,500 g of methylene chloride, 492 g of benzoyl chloride was added over 2 hours at 5-10° C. The mixture was then stirred for 10 hours at 25° C. Water was added to the reaction mixture to stop the reaction, followed by conventional aqueous work-up and purification by column chromatography. There was obtained 420 g of nitrilotriethane-2,1-diyl tribenzoate (yield 91%).

IR (KBr): v=3062, 2973, 2958, 2984, 2832, 1722, 1710, 1602, 1583, 1452, 1380, 1355, 1336, 1315, 1284, 1272, 1176, 1122, 1068, 1029, 931, 709 cm$^{-1}$

¹H-NMR (600 MHz in CDCl₃): δ=3.10 (6H, t, J=5.9 Hz), 4.44 (6H, t, J=5.9 Hz), 7.36 (6H, dd, J=8.3, 7.4 Hz), 7.51 (3H, tt, J=7.4, 1.4 Hz), 7.98 (6H, dd, J=8.3, 1.4 Hz)

Synthesis Example 2

Synthesis of nitrilotriethane-2,1-diyl tri(3,5-dimethoxybenzoate) (Amine 2)

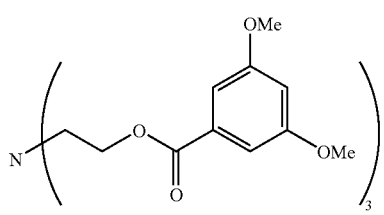

Amine 2

The procedure of Synthesis Example 1 was repeated except that an equimolar amount of 3,5-dimethoxybenzoyl chloride was used instead of the benzoyl chloride, to give nitrilotriethane-2,1-diyl tri(3,5-dimethoxybenzoate) in a yield of 87%.

Synthesis Example 3

Synthesis of nitrilotriethane-2,1-diyl tri(2-furancarboxylate) (Amine 3)

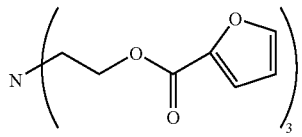

Amine 3

The procedure of Synthesis Example 1 was repeated except that an equimolar amount of 2-furoyl chloride was used instead of the benzoyl chloride, to give nitrilotriethane-2,1-diyl tri(2-furancarboxylate) in a yield of 84%.

Synthesis Example 4

Synthesis of [(2-methoxyethyl)imino]diethane-2,1-diyl di(4-methylbenzoate) (Amine 4)

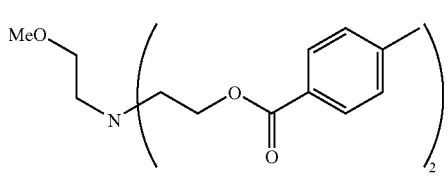

Amine 4

The procedure of Synthesis Example 1 was repeated except that 2,2'-[(2-methoxyethyl)imino]diethanol was used instead of the triethanol amine, and 4-methylbenzoyl chloride was used instead of the benzoyl chloride, to give [(2-methoxyethyl)imino]diethane-2,1-diyl di(4-methylbenzoate) in a yield of 93%.

Synthesis Example 5

Synthesis of [(2-cyanoethyl)imino]diethane-2,1-diyl dibenzoate (Amine 5)

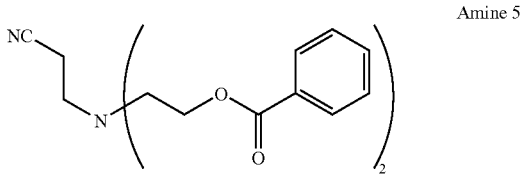

Amine 5

The procedure of Synthesis Example 1 was repeated except that 2,2'-[(2-cyanoethyl)imino]diethanol was used instead of the triethanol amine, to give [(2-cyanoethyl)imino]diethane-2,1-diyl dibenzoate in a yield of 90%.

IR (KBr): ν=2954, 2861, 2248, 1716, 1706, 1600, 1583, 1452, 1386, 1367, 1346, 1311, 1272, 1174, 1118, 1070, 1043, 1025, 985, 921, 711 cm⁻¹

¹H-NMR (600 MHz in CDCl₃): δ=2.50 (2H, t, J=7.0 Hz), 3.04 (4H, t, J=5.6 Hz), 3.04 (2H, t, J=7.0 Hz), 4.42 (4H, t, J=5.6 Hz), 7.41 (4H, dd, J=8.6, 7.4 Hz), 7.54 (2H, tt, J=7.4, 1.2 Hz), 8.00 (4H, dd, J=8.6, 1.2 Hz)

Synthesis Example 6

Synthesis of 2-(1-pyrrolidinyl)ethyl benzoate (Amine 6)

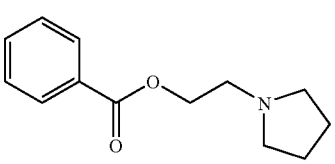

Amine 6

The procedure of Synthesis Example 1 was repeated except that 2-(1-pyrrolidinyl)ethanol was used instead of the triethanolamine, to give 2-(1-pyrrolidinyl)ethyl benzoate in a yield of 97%.

Synthesis Example 7

Synthesis of 2-morpholinoethyl 1-naphthalenecarboxylate (Amine 7)

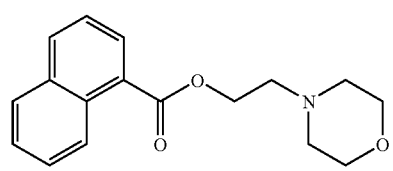

Amine 7

The procedure of Synthesis Example 1 was repeated except that 2-morpholinoethanol was used instead of the triethanolamine, and 1-naphthoyl chloride was used instead of the benzoyl chloride, to give 2-morpholinoethyl 1-naphthalenecarboxylate in a yield of 94%.

IR (thin film): ν=2958, 2854, 2807, 1712, 1637, 1592, 1577, 1510, 1454, 1278, 1245, 1197, 1135, 1118, 1070, 1033, 1016, 943, 916, 860, 782 cm$^{-1}$ $^1$H-NMR (600 MHz in CDCl$_3$): δ=2.60 (4H, m), 2.83 (2H, t, J=5.8 Hz), 3.74 (4H, t, J=4.7 Hz), 4.55 (2H, t, J=5.8 Hz), 7.50 (1H, dd, J=7.9, 7.2 Hz), 7.54 (1H, ddd, J=7.9, 6.9, 1.4 Hz), 7.61 (1H, ddd, J=8.6, 6.9, 1.4 Hz), 7.89 (1H, br. d, J=7.9 Hz), 8.02 (1H, d, J=8.79 Hz), 8.16 (1H, dd, J=7.2, 1.4 Hz), 8.93 (1H, dd, J=8.9, 0.7 Hz)

Synthesis Example 8

Synthesis of 2-morpholinoethyl 2-naphthalenecarboxylate (Amine 8)

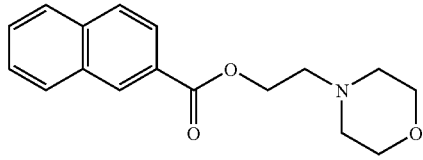

Amine 8

The procedure of Synthesis Example 1 was repeated except that 2-morpholinoethanol was used instead of the triethanolamine, and 2-naphthoyl chloride was used instead of the benzoyl chloride, to give 2-morpholinoethyl 2-naphthalenecarboxylate in a yield of 95%.

IR (KBr): ν=2954, 2854, 2894, 1716, 1467, 1446, 1351, 1290, 1232, 1195, 1130, 1114, 1097, 1070, 1008, 973, 914, 867, 781, 765 cm$^{-1}$ $^1$H-NMR (600 MHz in CDCl$_3$): δ=2.60 (4H, m), 2.82 (2H, t, J=6.0 Hz), 3.73 (4H, t, J=4.6 Hz), 4.52 (2H, t, J=6.0 Hz), 7.54 (1H, m), 7.59 (1H, m), 7.88 (1H, d, J=8.2 Hz), 7.88 (1H, d, J=8.6 Hz), 7.96 (1H, d, J=8.2 Hz), 8.51 (1H, dd, J=8.6, 1.7 Hz), 8.60 (1H, m)

Synthesis Example 9

Synthesis of 2-morpholinoethyl 4-phenylbenzoate (Amine 9)

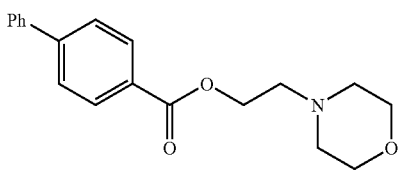

Amine 9

The procedure of Synthesis Example 1 was repeated except that 2-morpholinoethanol was used instead of the triethanolamine, and 4-phenylbenzoyl chloride was used instead of the benzoyl chloride, to give 2-morpholinoethyl 4-phenylbenzoate in a yield of 93%.

IR (KBr): ν=2966, 2944, 2917, 2888, 2865, 2852, 2819, 2782, 1714, 1608, 1488, 1475, 1452, 1407, 1376, 1338, 1328, 1278, 1199, 1186, 1143, 1116, 1076, 1066, 1035, 1020, 1008, 975, 916, 873, 860, 752, 696 cm$^{-1}$ $^1$H-NMR (600 MHz in CDCl$_3$): δ=2.59 (4H, m), 2.80 (2H, t, J=5.9 Hz), 3.73 (4H, t, J=4.8 Hz), 4.49 (2H, t, J=5.9 Hz), 7.40 (1H, tt, J=7.6, 1.2 Hz), 7.47 (2H, dd, J=8.4, 7.6 Hz), 7.62 (2H, dd, J=8.4, 1.2 Hz), 7.67 (2H, d, J=8.3 Hz), 8.10 (2H, d, J=8.3 Hz)

Synthesis Example 10

Synthesis of 2-(1,4,7,10,13-pentaoxa-16-azacyclooctadecan-16-yl)ethyl benzoate (Amine 10)

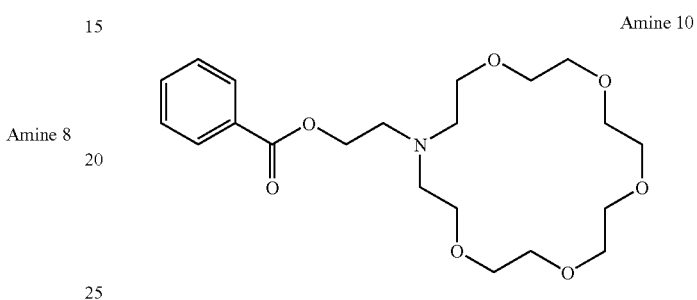

Amine 10

A mixture of 26.3 g of 1-aza-18-crown-6, 19.9 g of 2-chloroethyl benzoate, 21.0 g of potassium carbonate, and 60 g of N,N-dimethylformamide was stirred for 10 hours at 80° C. The reaction mixture was subjected to conventional aqueous work-up and purification by column chromatography. There was obtained 320 g of 2-(1,4,7,10,13-pentaoxa-16-azacyclo-octadecan-16-yl)ethyl benzoate (yield 75%).

Synthesis Example 11

Synthesis of 2-(1H-imidazol-1-yl)ethyl 2-naphthalenecarboxylate (Amine 11)

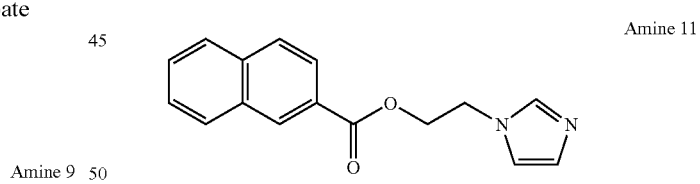

Amine 11

The procedure of Synthesis Example 1 was repeated except that 2-(1H-imidazol-1-yl)ethanol was used instead of the triethanolamine, and 2-naphthoyl chloride was used instead of the benzoyl chloride, to give 2-(1H-imidazol-1-yl)ethyl 2-naphthalenecarboxylate in a yield of 81%.

IR (KBr): ν=3120, 3101, 3056, 2954, 1710, 1629, 1510, 1459, 1444, 1403, 1351, 1326, 1307, 1288, 1238, 1230, 1199, 1130, 1110, 1097, 1083, 1029, 906, 838, 825, 784, 767, 748 cm$^{-1}$ $^1$H-NMR (600 MHz in CDCl$_3$): δ=4.36 (2H, t, J=5.3 Hz), 4.63 (2H, t, J=5.3 Hz), 7.04 (1H, t, J=1.4 Hz), 7.11 (1H, m), 7.55 (1H, m), 7.60 (1H, m), 7.60 (1H, m), 7.87 (1H, m), 7.88 (1H, d, J=8.6 Hz), 7.94 (1H, m), 7.99 (1H, dd, J=8.6, 1.7 Hz), 8.55 (1H, m)

Synthesis Example 12

Synthesis of 2-(1H-benzimidazol-1-yl)ethyl benzoate (Amine 12)

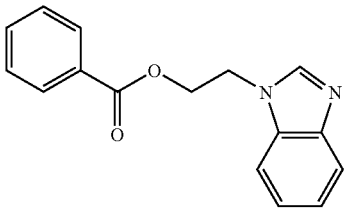
Amine 12

The procedure of Synthesis Example 10 was repeated except that benzimidazole was used instead of the 1-aza-18-crown-6, to give 2-(1H-benzimidazol-1-yl)ethyl benzoate in a yield of 80%.

IR (KBr): v=3078, 3057, 3051, 3035, 3005, 2981, 2951, 1714, 1616, 1600, 1583, 1494, 1459, 1450, 1438, 1378, 1365, 1332, 1315, 1282, 1209, 1120, 1099, 1072, 1027, 1020, 742, 713 cm$^{-1}$ $^1$H-NMR (600 MHz in CDCl$_3$): δ=4.55 (2H, t, J=5.4 Hz), 4.66 (2H, t, J=5.4 Hz), 7.30-7.33 (2H, m), 7.41 (2H, dd, J=7.9, 7.2 Hz), 7.46 (1H, m), 7.55 (1H, tt, J=7.2, 1.7 Hz), 7.83 (1H, m), 7.93 (2H, dd, J=7.9, 1.7 Hz), 7.98 (1H, s)

Synthesis Example 13

Synthesis of 2-(2-phenyl-1H-benzimidazol-1-yl) ethyl 4-methoxybenzoate (Amine 13)

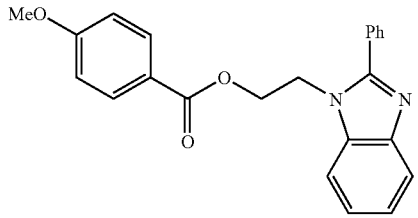
Amine 13

The procedure of Synthesis Example 10 was repeated except that benzimidazole was used instead of the 1-aza-18-crown-6, and 2-chloroethyl 4-methoxybenzoate was used instead of the 2-chloroethyl benzoate, to give 2-(2-phenyl-1H-benzimidazol-1-yl)ethyl 4-methoxybenzoate in a yield of 71%.

Synthesis Example 14

Synthesis of 3-morpholinopropane-1,2-diyl dibenzoate (Amine 14)

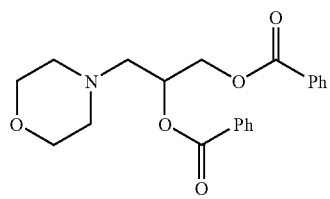
Amine 14

The procedure of Synthesis Example 1 was repeated except that 3-morpholinopropane-1,2-diol was used instead of the triethanolamine, to give 3-morpholinopropane-1,2-diyl dibenzoate in a yield of 92%.

IR (thin film): v=2960, 2854, 2811, 1720, 1602, 1585, 1452, 1315, 1280, 1265, 1176, 1116, 1070, 1025, 1012, 867, 709 cm$^{-1}$ $^1$H-NMR (600 MHz in CDCl$_3$): δ=2.58 (4H, m), 2.73 (1H, dd, J=13.1, 6.5 Hz), 2.76 (1H, dd, J=13.1, 6.2 Hz), 3.68 (4H, m), 4.58 (1H, dd, J=12.0, 6.5 Hz), 4.71 (1H, dd, J=12.0, 3.5 Hz), 5.62 (1H, ddt, J=6.2, 3.5, 6.5 Hz), 7.42 (2H, t, J=7.9 Hz), 7.44 (2H, t, J=7.9 Hz), 7.55 (1H, t, J=7.9 Hz), 7.56 (1H, t, J=7.9 Hz), 8.01 (2H, d, J=7.9 Hz), 8.04 (2H, d, J=7.9 Hz)

Synthesis Example 15

Synthesis of [(3-cyanopropyl)imino]diethane-2,1-diyl dibenzoate (Amine 15)

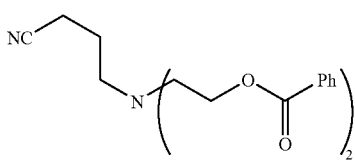
Amine 15

The procedure of Synthesis Example 1 was repeated except that 2,2'-[(3-cyanopropyl)imino]diethanol was used instead of the triethanolamine, to give [(3-cyanopropyl)imino]diethane-2,1-diyl dibenzoate in a yield of 83%.

Synthesis Example 16

Synthesis of nitrilotriethane-2,1-diyl tri(4-methoxybenzoate) (Amine 16)

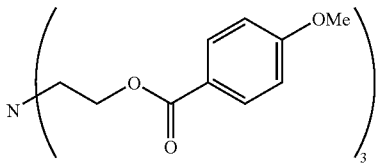
Amine 16

The procedure of Synthesis Example 1 was repeated except that an equimolar amount of 4-methoxybenzoyl chloride was used instead of the benzoyl chloride, to give nitrilotriethane-2,1-diyl tri(4-methoxybenzoate) in a yield of 81%.

$^1$H-NMR (600 MHz in CDCl$_3$): δ=3.06 (6H, t, J=5.8 Hz), 3.81 (9H, s), 4.40 (6H, t, J=5.8 Hz), 6.82 (6H, m), 7.93 (6H, m)

$^{13}$C-NMR (150 MHz in CDCl$_3$): δ=53.42, 55.33, 62.84, 113.53, 122.51, 131.53, 163.25, 166.22

EXAMPLES

Resist compositions were prepared by using nitrogen-containing organic compounds of the invention, and evaluated for resolution and pattern profile by carrying out the patterning process of the invention.

The base polymer (Polymers 1 to 14), photoacid generator (PAG1 to 5), dissolution rate inhibitor (DRI) and crosslinker used in Examples are identified below by their structural formula. Note that PGMEA is propylene glycol monomethyl ether acetate. Weight and number average molecular weights, Mw and Mn, are determined by gel permeation chromatography (GPC) using polystyrene standards.

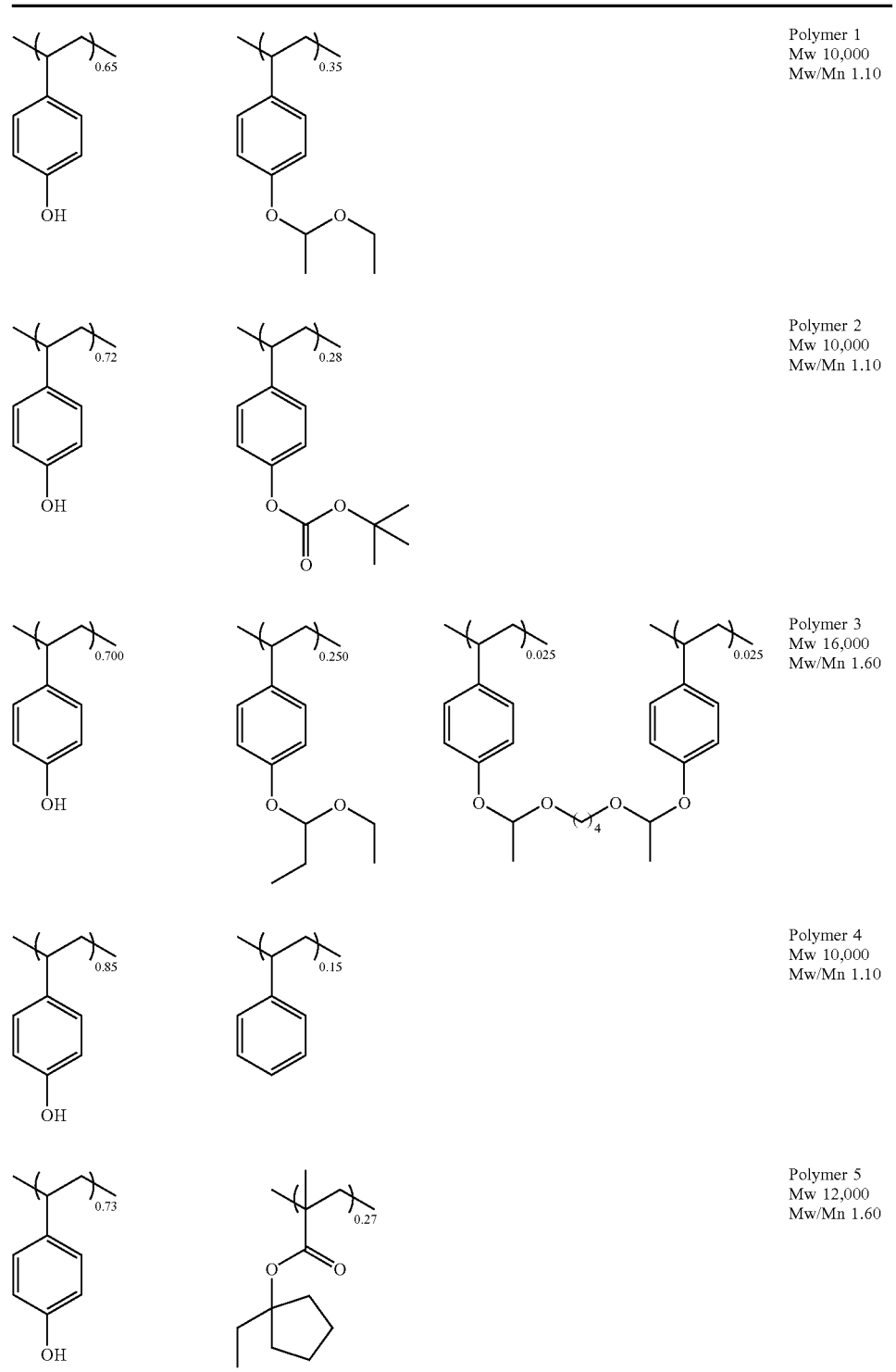

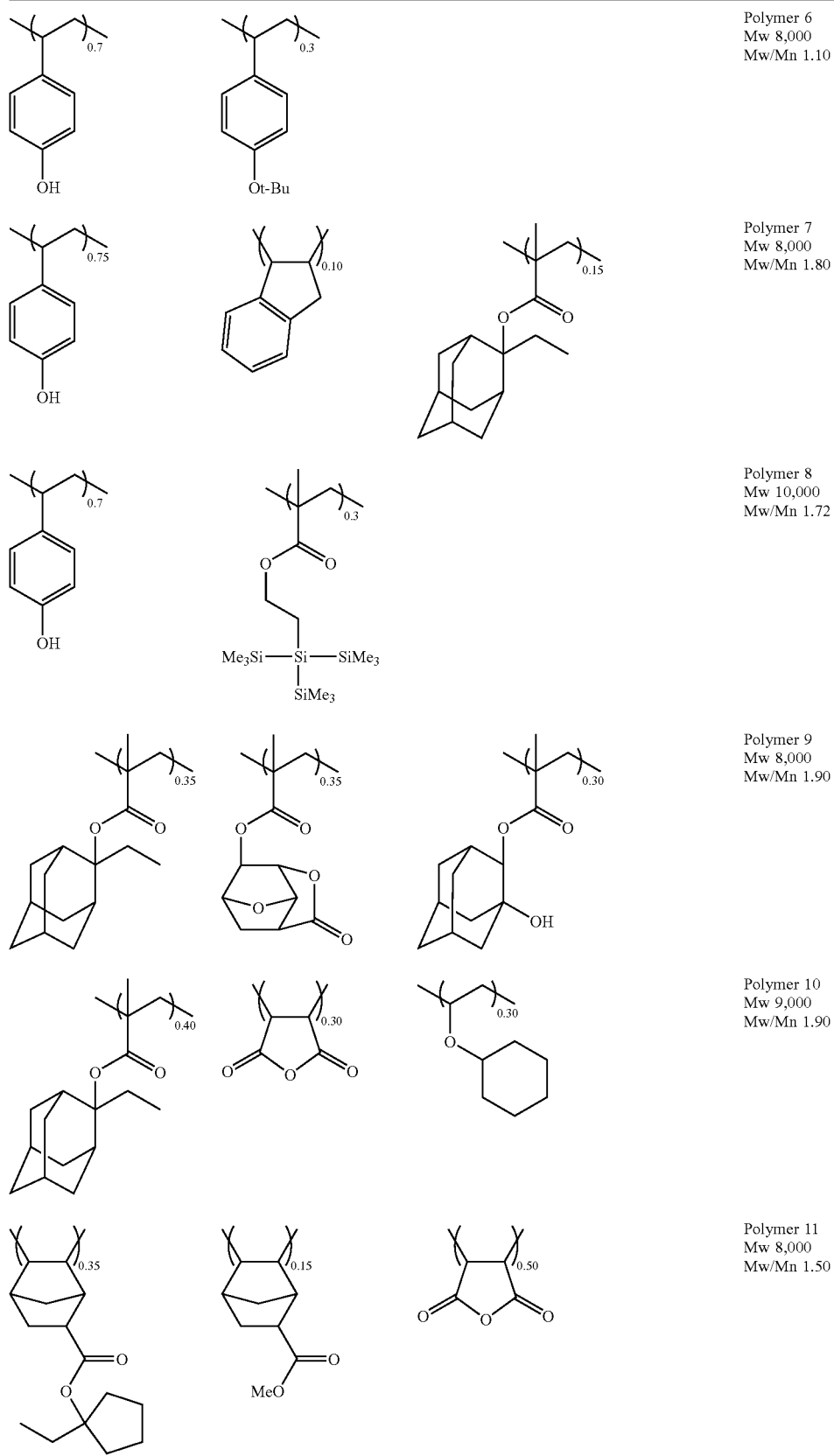

-continued
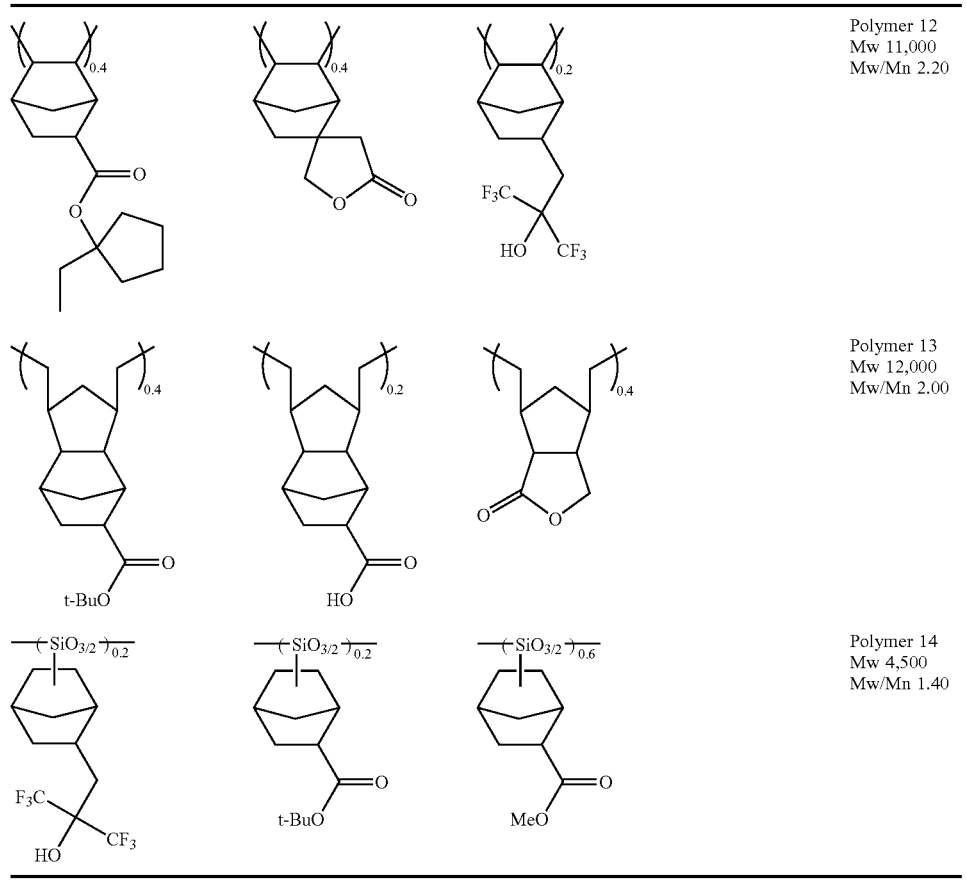
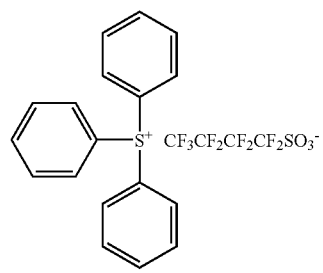
PAG 1
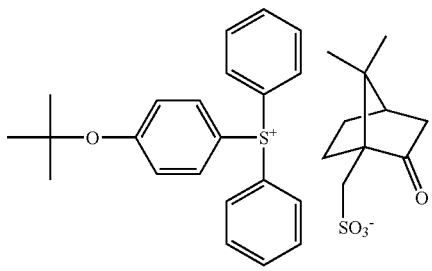
PAG 3
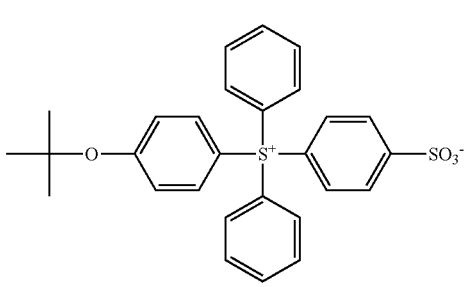
PAG 4
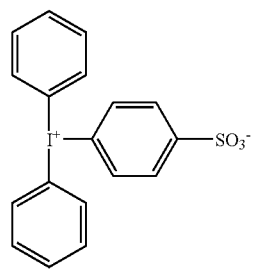
PAG 2
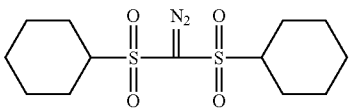
PAG 5

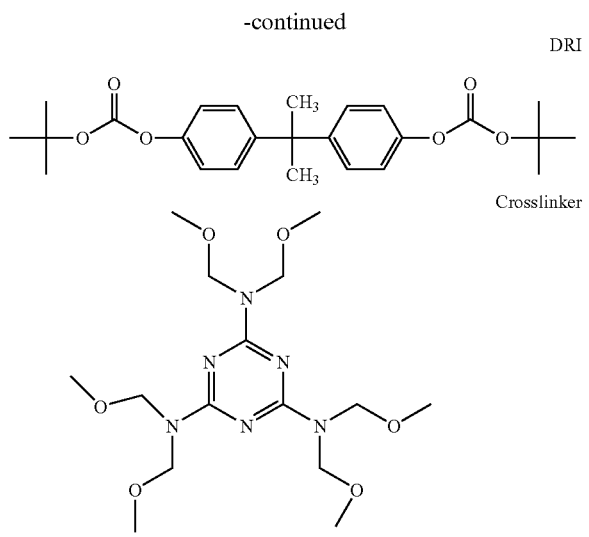

| Components | Parts by weight |
|---|---|
| PGMEA | 280 |
| ethyl lactate | 120 |
| (D) N-containing compound (Amine 1) | 0.1 |

The resulting resist solution was spin-coated onto a silicon wafer substrate having an antireflective coatings (DUV-30 by Nissan Chemical Industries, Ltd., 55 nm) coated thereon, then baked at 120° C. for 90 seconds, forming a resist film having a thickness of 550 nm. The resist film was exposed using an excimer laser stepper NSR-S203B (by Nikon Corporation; NA=0.68; σ=0.75; ⅔ annular illumination), then heat treated at 110° C. for 90 seconds, cooled to 23° C., and subjected to puddle development with a 2.38 wt % aqueous solution of tetramethylammonium hydroxide at 23° C. for 60 seconds, forming a 1:1 line-and-space pattern. The wafer as developed was observed under a top-down SEM. At the optimum exposure dose which provided a 1:1 resolution of a 0.18 μm line-and-space pattern, a 0.15 μm line-and-space pattern was kept separated and resolved without peeling. A cross section of the resist pattern was also observed to find that the pattern profile was rectangular and perpendicular to the substrate.

Examples 2-24 and Comparative Examples 1-14

Resist compositions were prepared as in Example 1 using the nitrogen-containing organic compounds (Amines 2 to 15) obtained in Synthesis Examples 2 to 15 and comparative nitrogen-containing organic compounds. The resist compositions were evaluated for resolution and pattern profile.

Based on the results of these tests, the resolution of the 0.15 μm line-and-space pattern is classified into ratings of passed (○), mediocre (Δ) and rejected (X) as tabulated in Table 1 (Examples) and Table 2 (Comparative Examples), with the pattern profile observed being reported together.

Example 1

A resist composition was prepared by using the nitrogen-containing organic compound (Amine 1) obtained in Synthesis Example 1, combining it with other components in accordance with the following recipe, and filtering the resulting solution through a Teflon® filter having a pore diameter of 0.2 μm.

| Components | Parts by weight |
|---|---|
| (A) base polymer (Polymer 3) | 100 |
| (B) photoacid generator (PAG 5) | 2.0 |
| (C) Solvent | |

TABLE 1

| Example | Polymer | Photoacid generator | N-containing compound | Dissolution rate inhibitor/ Crosslinker (pbw) | 0.15 μm resolution | Pattern profile |
|---|---|---|---|---|---|---|
| 1 | Polymer 3 | PAG 5 | Amine 1 | — | ○ | rectangular, perpendicular |
| 2 | Polymer 3 | PAG 5 | Amine 2 | — | ○ | rectangular, perpendicular |
| 3 | Polymer 3 | PAG 5 | Amine 3 | — | ○ | rectangular, perpendicular |
| 4 | Polymer 3 | PAG 5 | Amine 4 | — | ○ | rectangular, perpendicular |
| 5 | Polymer 3 | PAG 5 | Amine 5 | — | ○ | rectangular, perpendicular |
| 6 | Polymer 3 | PAG 5 | Amine 6 | — | ○ | rectangular, perpendicular |
| 7 | Polymer 3 | PAG 5 | Amine 7 | — | ○ | rectangular, perpendicular |
| 8 | Polymer 3 | PAG 5 | Amine 8 | — | ○ | rectangular, perpendicular |
| 9 | Polymer 3 | PAG 5 | Amine 9 | — | ○ | rectangular, perpendicular |
| 10 | Polymer 3 | PAG 5 | Amine 10 | — | ○ | rectangular, perpendicular |
| 11 | Polymer 3 | PAG 5 | Amine 11 | — | ○ | rectangular, perpendicular |
| 12 | Polymer 3 | PAG 5 | Amine 12 | — | ○ | rectangular, perpendicular |

TABLE 1-continued

| Example | Polymer | Photoacid generator | N-containing compound | Dissolution rate inhibitor/ Crosslinker (pbw) | 0.15 μm resolution | Pattern profile |
|---|---|---|---|---|---|---|
| 13 | Polymer 3 | PAG 5 | Amine 13 | — | ○ | rectangular, perpendicular |
| 14 | Polymer 3 | PAG 5 | Amine 14 | — | ○ | rectangular, perpendicular |
| 15 | Polymer 3 | PAG 5 | Amine 15 | — | ○ | rectangular, perpendicular |
| 16 | Polymer 1 | PAG 5 | Amine 2 | — | ○ | rectangular, perpendicular |
| 17 | Polymer 2 | PAG 5 | Amine 2 | — | ○ | rectangular, perpendicular |
| 18 | Polymer 3 | PAG 4 | Amine 2 | — | ○ | rectangular, perpendicular |
| 19 | Polymer 4 | PAG 2 | Amine 2 | Crosslinker (15) | ○ | rectangular, perpendicular |
| 20 | Polymer 5 | PAG 3 | Amine 2 | — | ○ | rectangular, perpendicular |
| 21 | Polymer 5 | PAG 2 | Amine 2 | DRI (15) | ○ | rectangular, perpendicular |
| 22 | Polymer 6 | PAG 1 | Amine 2 | — | ○ | rectangular, perpendicular |
| 23 | Polymer 7 | PAG 4 | Amine 2 | — | ○ | rectangular, perpendicular |
| 24 | Polymer 8 | PAG 1 | Amine 2 | — | ○ | rectangular, perpendicular |

TABLE 2

| Comparative Example | Polymer | Photoacid generator | N-containing compound/ Dissolution rate inhibitor, Crosslinker (pbw) | 0.15 μm resolution | Pattern profile |
|---|---|---|---|---|---|
| 1 | Polymer 3 | PAG 5 | trioctylamine | X | — |
| 2 | Polymer 3 | PAG 5 | 1,8-diazabicyclo[5.4.0]-7-undecene | X | — |
| 3 | Polymer 3 | PAG 5 | triethanolamine | Δ | top-loss, rounded top, tapered |
| 4 | Polymer 3 | PAG 5 | tris(2-methoxyethyl)-amine | X | — |
| 5 | Polymer 3 | PAG 5 | tris(2-acetoxyethyl)-amine | Δ | top-loss, rounded top, tapered |
| 6 | Polymer 1 | PAG 5 | triethanolamine | Δ | top-loss, rounded top, tapered |
| 7 | Polymer 2 | PAG 5 | triethanolamine | X | — |
| 8 | Polymer 3 | PAG 4 | triethanolamine | Δ | top-loss, rounded top, tapered |
| 9 | Polymer 4 | PAG 2 | triethanolamine/ Crosslinker (15) | X | — |
| 10 | Polymer 5 | PAG 3 | triethanolamine | Δ | top-loss, rounded top, tapered |
| 11 | Polymer 5 | PAG 2 | triethanolamine/DRI (15) | Δ | top-loss, rounded top, tapered |
| 12 | Polymer 6 | PAG 1 | triethanolamine | X | — |
| 13 | Polymer 7 | PAG 4 | triethanolamine | Δ | top-loss, rounded top, tapered |
| 14 | Polymer 8 | PAG 1 | triethanolamine | X | — |

Example 25

A resist composition was prepared by using the nitrogen-containing organic compound (Amine 1) obtained in Synthesis Example 1, combining it with other components in accordance with the following recipe, and filtering the resulting solution through a Teflon® filter having a pore diameter of 0.2 μm.

| Components | Parts by weight |
| --- | --- |
| (A) base polymer (Polymer 11) | 80 |
| (B) photoacid generator (PAG 1) | 2.0 |
| (C) Solvent (PGMEA) | 640 |
| (D) N-containing compound (Amine 1) | 0.25 |

The resulting resist solution was spin-coated onto a silicon wafer substrate having an antireflective coatings (ARC29A by Nissan Chemical Industries, Ltd., 78 nm) coated thereon, then baked at 130° for 60 seconds, forming a resist film having a thickness of 300 nm. The resist film was exposed using an ArF excimer laser stepper (by Nikon Corporation; NA=0.68), then heat treated at 115° for 60 seconds, cooled to 23°, and subjected to puddle development with a 2.38 wt % aqueous solution of tetramethylammonium hydroxide at 23° for 60 seconds, forming a 1:1 line-and-space pattern. The wafer as developed was observed under a top-down SEM. At the optimum exposure dose which provided a 1:1 resolution of a 0.15 μm line-and-space pattern, a 0.13 μm line-and-space pattern was kept separated and resolved without peeling. A cross section of the resist pattern was also observed to find that the pattern profile was rectangular and perpendicular to the substrate.

Examples 26-44 and Comparative Examples 15-24

Resist compositions were prepared as in Example 25 using the nitrogen-containing organic compounds (Amines 2 to 15) obtained in Synthesis Examples 2 to 15 and comparative nitrogen-containing organic compounds. The resist compositions were evaluated for resolution and pattern profile.

Based on the results of these tests, the resolution of the 0.13 μm line-and-space pattern is classified into ratings of passed (○), mediocre (Δ) and rejected (X) as tabulated in Table 3 (Examples) and Table 4 (Comparative Examples), with the pattern profile observed being reported together.

TABLE 3

| Example | Polymer | Photoacid generator | N-containing compound | Dissolution rate inhibitor/ Crosslinker (pbw) | 0.13 μm resolution | Pattern profile |
| --- | --- | --- | --- | --- | --- | --- |
| 25 | Polymer 9 | PAG 1 | Amine 1 | — | ○ | rectangular, perpendicular |
| 26 | Polymer 9 | PAG 1 | Amine 2 | — | ○ | rectangular, perpendicular |
| 27 | Polymer 9 | PAG 1 | Amine 3 | — | ○ | rectangular, perpendicular |
| 28 | Polymer 9 | PAG 1 | Amine 4 | — | ○ | rectangular, perpendicular |
| 29 | Polymer 9 | PAG 1 | Amine 5 | — | ○ | rectangular, perpendicular |
| 30 | Polymer 9 | PAG 1 | Amine 6 | — | ○ | rectangular, perpendicular |
| 31 | Polymer 9 | PAG 1 | Amine 7 | — | ○ | rectangular, perpendicular |
| 32 | Polymer 9 | PAG 1 | Amine 8 | — | ○ | rectangular, perpendicular |
| 33 | Polymer 9 | PAG 1 | Amine 9 | — | ○ | rectangular, perpendicular |
| 34 | Polymer 9 | PAG 1 | Amine 10 | — | ○ | rectangular, perpendicular |
| 35 | Polymer 9 | PAG 1 | Amine 11 | — | ○ | rectangular, perpendicular |
| 36 | Polymer 9 | PAG 1 | Amine 12 | — | ○ | rectangular, perpendicular |
| 37 | Polymer 9 | PAG 1 | Amine 13 | — | ○ | rectangular, perpendicular |
| 38 | Polymer 9 | PAG 1 | Amine 14 | — | ○ | rectangular, perpendicular |
| 39 | Polymer 9 | PAG 1 | Amine 15 | — | ○ | rectangular, perpendicular |
| 40 | Polymer 10 | PAG 1 | Amine 8 | — | ○ | rectangular, perpendicular |
| 41 | Polymer 11 | PAG 1 | Amine 8 | — | ○ | rectangular, perpendicular |
| 42 | Polymer 12 | PAG 1 | Amine 8 | — | ○ | rectangular, perpendicular |
| 43 | Polymer 13 | PAG 1 | Amine 8 | — | ○ | rectangular, perpendicular |
| 44 | Polymer 14 | PAG 1 | Amine 8 | — | ○ | rectangular, perpendicular |

TABLE 4

| Comparative Example | Polymer | Photoacid generator | N-containing compound | 0.13 µm resolution | Pattern profile |
|---|---|---|---|---|---|
| 15 | Polymer 9 | PAG 1 | trioctylamine | X | — |
| 16 | Polymer 9 | PAG 1 | 1,8-diazabicyclo[5.4.0]-7-undecene | X | — |
| 17 | Polymer 9 | PAG 1 | triethanolamine | ○ | top-loss, rounded top, tapered |
| 18 | Polymer 9 | PAG 1 | tris(2-methoxyethyl)-amine | X | — |
| 19 | Polymer 9 | PAG 1 | tris(2-acetoxyethyl)-amine | ○ | rounded top, tapered |
| 20 | Polymer 10 | PAG 1 | triethanolamine | ○ | top-loss, rounded top, tapered |
| 21 | Polymer 11 | PAG 1 | triethanolamine | Δ | top-loss, rounded top, tapered |
| 22 | Polymer 12 | PAG 1 | triethanolamine | X | — |
| 23 | Polymer 13 | PAG 1 | triethanolamine | Δ | top-loss, rounded top, tapered |
| 24 | Polymer 14 | PAG 1 | triethanolamine | X | — |

It is seen from the above results that the resist compositions within the scope of the invention are improved in resolution and pattern profile.

Japanese Patent Application No. 2003-384505 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive-working chemically amplified resist composition comprising:
(A) a nitrogen-containing organic compound having an aromatic carboxylic acid ester structure;
(B) an organic solvent;
(C) a base resin having an acid labile group-protected acidic functional group which is alkali-insoluble or substantially alkali-insoluble, but becomes alkali-soluble when the acid labile group is eliminated; and
(D) a photoacid generator.

2. A negative-working chemically amplified resist composition comprising:
(A) a nitrogen-containing organic compound having an aromatic carboxylic acid ester structure;
(B) an organic solvent;
(C') a base resin which is alkali-soluble, but becomes substantially alkali-insoluble when crosslinked with a crosslinking agent;
(D) a photoacid generator; and
(E) a crosslinking agent which induces crosslinkage under the action of an acid.

3. A patterning process comprising the steps of:
(1) applying the chemically amplified resist composition of claim 1 onto a substrate;
(2) heat treating the applied resist, then exposing the heat-treated resist through a photomask to high-energy radiation having a wavelength of up to 300 nm or an electron beam; and
(3) heat treating the exposed resist, then developing the resist with a developer.

4. A patterning process comprising the steps of:
(1) applying the chemically amplified resist composition of claim 2 onto a substrate;
(2) heat treating the applied resist, then exposing the heat-treated resist through a photomask to high-energy radiation having a wavelength of up to 300 nm or an electron beam; and
(3) heat treating the exposed resist, then developing the resist with a developer.

5. The chemically amplified resist composition of claim 1 or 2, comprising as component (A) at least one nitrogen-containing organic compound having an aromatic carboxylic acid ester structure, represented by the general formula (1):

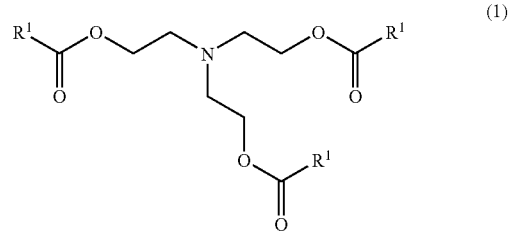

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups.

6. The chemically amplified resist composition of claim 1 or 2, comprising as component (A) at least one nitrogen-containing organic compound having an aromatic carboxylic acid ester structure, represented by the general formula (2):

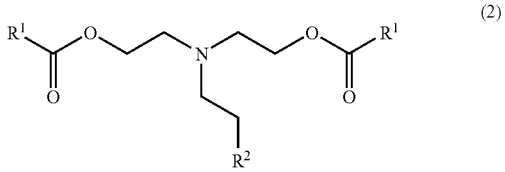

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^2$ is $CO_2R^3$, $OR^4$ or cyano group; $R^3$ is a $C_1$-$C_{10}$ alkyl group in which at least one methylene moiety may be substituted with an oxygen atom; and $R^4$ is a $C_1$-$C_{10}$ alkyl group or acyl group in which at least one methylene moiety may be substituted with an oxygen atom.

7. The chemically amplified resist composition of claim 1 or 2, comprising as component (A) at least one nitrogen-containing organic compound having an aromatic carboxylic acid ester structure, represented by the general formula (3):

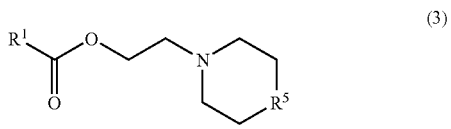

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^5$ is a single bond, methylene, ethylene, sulfur atom or —$O(CH_2CH_2O)_n$— group; and n is equal to 0, 1, 2, 3 or 4.

8. The chemically amplified resist composition of claim 1 or 2, comprising as component (A) at least one nitrogen-containing organic compound having an aromatic carboxylic acid ester structure, represented by the general formula (4):

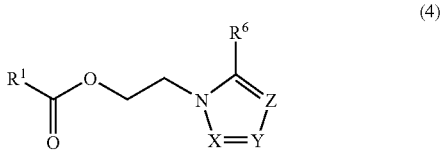

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^6$ is hydrogen, methyl, ethyl or phenyl; X is a nitrogen atom or $CR^7$; Y is a nitrogen atom or $CR^8$; Z is a nitrogen atom or $CR^9$; $R^7$, $R^8$ and $R^9$ are each independently hydrogen, methyl or phenyl, or $R^7$ and $R^8$, or $R^8$ and $R^9$, taken together, may form a $C_6$-$C_{20}$ aromatic ring or $C_2$-$C_{20}$ hetero-aromatic ring.

9. A chemically amplified resist composition comprising (A) at least one nitrogen-containing organic compound having an aromatic carboxylic acid ester structure, represented by the general formula (1):

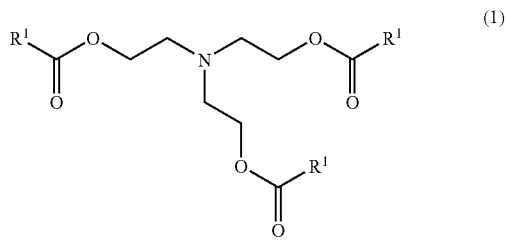

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups.

10. A chemically amplified resist composition comprising (A) at least one nitrogen-containing organic compound having an aromatic carboxylic acid ester structure, represented by the general formula (2):

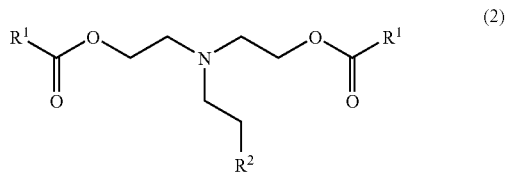

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^2$ is $CO_2R^3$, $OR^4$ or cyano group; $R^3$ is a $C_1$-$C_{10}$ alkyl group in which at least one methylene moiety may be substituted with an oxygen atom; and $R^4$ is a $C_1$-$C_{10}$ alkyl group or acyl group in which at least one methylene moiety may be substituted with an oxygen atom.

11. A chemically amplified resist composition comprising (A) at least one nitrogen-containing organic compound having an aromatic carboxylic acid ester structure, represented by the general formula (3):

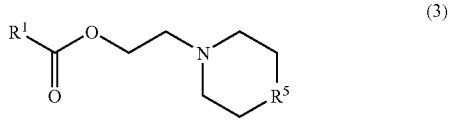

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^5$ is a single bond, methylene, ethylene, sulfur atom or —$O(CH_2CH_2O)_n$— group; and n is equal to 0, 1, 2, 3 or 4.

12. A chemically amplified resist composition comprising (A) at least one nitrogen-containing organic compound having an aromatic carboxylic acid ester structure, represented by the general formula (4):

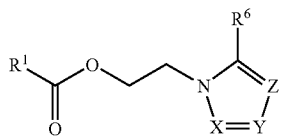 (4)

wherein $R^1$ is a $C_6$-$C_{20}$ aryl group or $C_4$-$C_{20}$ hetero-aromatic group in which some or all of the hydrogen atoms may be substituted with halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups; $R^6$ is hydrogen, methyl, ethyl or phenyl; X is a nitrogen atom or $CR^7$; Y is a nitrogen atom or $CR^8$; Z is a nitrogen atom or $CR^9$; $R^7$, $R^8$ and $R^9$ are each independently hydrogen, methyl or phenyl, or $R^7$ and $R^8$, or $R^8$ and $R^9$, taken together, may form a $C_6$-$C_{20}$ aromatic ring or $C_2$-$C_{20}$ hetero-aromatic ring.

* * * * *